US008466542B2

(12) United States Patent
Kriman et al.

(10) Patent No.: US 8,466,542 B2
(45) Date of Patent: Jun. 18, 2013

(54) STACKED MICROELECTRONIC ASSEMBLIES HAVING VIAS EXTENDING THROUGH BOND PADS

(75) Inventors: Moshe Kriman, Charlotte, NC (US); Osher Avsian, Huntersville, NC (US); Belgacem Haba, Saratoga, CA (US); Giles Humpston, Buckinghamshire (GB); Dmitri Burshtyn, Jerusalem (IL)

(73) Assignee: Tessera, Inc., San Jose, CA (US)

( * ) Notice: Subject to any disclaimer, the term of this patent is extended or adjusted under 35 U.S.C. 154(b) by 360 days.

(21) Appl. No.: 12/723,039

(22) Filed: Mar. 12, 2010

(65) Prior Publication Data

US 2010/0230795 A1 Sep. 16, 2010

Related U.S. Application Data

(60) Provisional application No. 61/210,100, filed on Mar. 13, 2009.

(51) Int. Cl.
*H01L 23/48* (2006.01)
*H01L 23/02* (2006.01)
*H01L 29/40* (2006.01)

(52) U.S. Cl.
USPC ............................ 257/686; 257/276; 257/777

(58) Field of Classification Search
USPC ......................................... 257/276, 686, 777
See application file for complete search history.

(56) References Cited

U.S. PATENT DOCUMENTS

| | | | |
|---|---|---|---|
| 4,074,342 A | 2/1978 | Honn et al. | |
| 4,500,905 A | 2/1985 | Shibata | |
| 4,765,864 A | 8/1988 | Holland et al. | |
| 4,842,699 A | 6/1989 | Hua et al. | |
| 4,897,708 A | 1/1990 | Clements | |
| 4,954,875 A | 9/1990 | Clements | |
| 5,322,816 A | 6/1994 | Pinter | |
| 5,343,071 A | 8/1994 | Kazior et al. | |

(Continued)

FOREIGN PATENT DOCUMENTS

| CN | 1913149 A | 2/2007 |
|---|---|---|
| DE | 19516487 C1 | 7/1996 |

(Continued)

OTHER PUBLICATIONS

Chinese Office Action for Application No. 200880109094.9 dated Jun. 30, 2011.

(Continued)

*Primary Examiner* — James Mitchell
(74) *Attorney, Agent, or Firm* — Lerner, David, Littenberg, Krumholz & Mentlik, LLP

(57) ABSTRACT

A stacked microelectronic assembly is provided which includes first and second stacked microelectronic elements. Each of the first and second microelectronic elements can include a conductive layer extending along a face of such microelectronic element. At least one of the first and second microelectronic elements can include a recess extending from the rear surface towards the front surface, and a conductive via extending from the recess through the bond pad and electrically connected to the bond pad, with a conductive layer connected to the via and extending along a rear face of the microelectronic element towards an edge of the microelectronic element. A plurality of leads can extend from the conductive layers of the first and second microelectronic elements and a plurality of terminals of the assembly can be electrically connected with the leads.

23 Claims, 31 Drawing Sheets

U.S. PATENT DOCUMENTS

| | | | |
|---|---|---|---|
| 5,412,539 A | 5/1995 | Elwell et al. | |
| 5,424,245 A | 6/1995 | Gurtler et al. | |
| 5,426,072 A | 6/1995 | Finnila | |
| 5,466,634 A | 11/1995 | Beilstein, Jr. et al. | |
| 5,563,084 A | 10/1996 | Ramm et al. | |
| 5,571,754 A | 11/1996 | Bertin et al. | |
| 5,604,673 A | 2/1997 | Washburn et al. | |
| 5,608,264 A | 3/1997 | Gaul | |
| 5,614,766 A | 3/1997 | Takasu et al. | |
| 5,618,752 A | 4/1997 | Gaul | |
| 5,646,067 A | 7/1997 | Gaul | |
| 5,656,553 A | 8/1997 | Leas et al. | |
| 5,661,087 A | 8/1997 | Pedersen et al. | |
| 5,682,062 A | 10/1997 | Gaul | |
| 5,716,759 A | 2/1998 | Badehi | |
| 5,766,984 A | 6/1998 | Ramm et al. | |
| 5,767,001 A | 6/1998 | Bertagnolli et al. | |
| 5,804,004 A | 9/1998 | Tuckerman et al. | |
| 5,814,889 A | 9/1998 | Gaul | |
| 5,817,530 A | 10/1998 | Ball | |
| 5,880,010 A | 3/1999 | Davidson | |
| 5,915,167 A | 6/1999 | Leedy | |
| 5,946,545 A | 8/1999 | Bertin et al. | |
| 5,973,386 A | 10/1999 | Horikawa | |
| 6,002,167 A | 12/1999 | Hatano et al. | |
| 6,022,758 A | 2/2000 | Badehi | |
| 6,031,274 A | 2/2000 | Muramatsu et al. | |
| 6,040,235 A | 3/2000 | Badehi | |
| 6,103,552 A | 8/2000 | Lin | |
| 6,130,823 A | 10/2000 | Lauder et al. | |
| 6,133,640 A | 10/2000 | Leedy | |
| 6,177,707 B1 | 1/2001 | Dekker et al. | |
| 6,177,721 B1 | 1/2001 | Suh et al. | |
| 6,188,129 B1 | 2/2001 | Paik et al. | |
| 6,204,562 B1 | 3/2001 | Ho et al. | |
| 6,208,545 B1 | 3/2001 | Leedy | |
| 6,228,686 B1 | 5/2001 | Smith et al. | |
| 6,252,305 B1 | 6/2001 | Lin et al. | |
| 6,261,865 B1 | 7/2001 | Akram | |
| 6,277,669 B1 | 8/2001 | Kung et al. | |
| 6,340,845 B1 | 1/2002 | Oda | |
| 6,344,401 B1 | 2/2002 | Lam | |
| 6,396,710 B1 | 5/2002 | Iwami et al. | |
| 6,472,247 B1 | 10/2002 | Andoh et al. | |
| 6,472,293 B1 | 10/2002 | Suga | |
| 6,486,546 B2 | 11/2002 | Moden et al. | |
| 6,492,201 B1 | 12/2002 | Haba | |
| 6,498,381 B2 | 12/2002 | Halahan et al. | |
| 6,498,387 B2 | 12/2002 | Yang | |
| 6,548,391 B1 | 4/2003 | Ramm et al. | |
| 6,551,857 B2 | 4/2003 | Leedy | |
| 6,562,653 B1 | 5/2003 | Ma et al. | |
| 6,563,224 B2 | 5/2003 | Leedy | |
| 6,582,991 B1 | 6/2003 | Maeda et al. | |
| 6,607,938 B2 | 8/2003 | Kwon et al. | |
| 6,607,941 B2 | 8/2003 | Prabhu et al. | |
| 6,608,377 B2 | 8/2003 | Chang et al. | |
| 6,611,052 B2 | 8/2003 | Poo et al. | |
| 6,621,155 B1 | 9/2003 | Perino et al. | |
| 6,624,505 B2 | 9/2003 | Badehi | |
| 6,632,706 B1 | 10/2003 | Leedy | |
| 6,646,289 B1 | 11/2003 | Badehi | |
| 6,656,827 B1 | 12/2003 | Tsao et al. | |
| 6,693,358 B2 | 2/2004 | Yamada et al. | |
| 6,717,254 B2 | 4/2004 | Siniaguine | |
| 6,727,576 B2 | 4/2004 | Hedler et al. | |
| 6,730,997 B2 | 5/2004 | Beyne et al. | |
| 6,737,300 B2 | 5/2004 | Ding et al. | |
| 6,743,660 B2 | 6/2004 | Lee et al. | |
| 6,753,205 B2 | 6/2004 | Halahan | |
| 6,753,208 B1 | 6/2004 | MacIntyre | |
| 6,777,767 B2 | 8/2004 | Badehi | |
| 6,784,023 B2 | 8/2004 | Ball | |
| 6,806,559 B2 | 10/2004 | Gann et al. | |
| 6,828,175 B2 | 12/2004 | Wood et al. | |
| 6,844,241 B2 | 1/2005 | Halahan et al. | |
| 6,844,619 B2 | 1/2005 | Tago | |
| 6,864,172 B2 | 3/2005 | Noma et al. | |
| 6,867,123 B2 | 3/2005 | Katagiri et al. | |
| 6,870,249 B2 | 3/2005 | Egawa | |
| 6,878,608 B2 | 4/2005 | Brofman et al. | |
| 6,897,148 B2 | 5/2005 | Halahan et al. | |
| 6,958,285 B2 | 10/2005 | Siniaguine | |
| 6,972,480 B2 | 12/2005 | Zilber et al. | |
| 6,972,483 B1 | 12/2005 | Song | |
| 6,982,475 B1 | 1/2006 | MacIntyre | |
| 6,984,545 B2 | 1/2006 | Grigg et al. | |
| 6,984,885 B1 | 1/2006 | Harada et al. | |
| 7,001,825 B2 | 2/2006 | Halahan et al. | |
| 7,005,324 B2 | 2/2006 | Imai | |
| 7,034,401 B2 | 4/2006 | Savastiouk et al. | |
| 7,049,170 B2 | 5/2006 | Savastiouk et al. | |
| 7,060,601 B2 | 6/2006 | Savastiouk et al. | |
| 7,087,459 B2 | 8/2006 | Koh | |
| 7,115,986 B2 | 10/2006 | Moon et al. | |
| 7,138,295 B2 | 11/2006 | Leedy | |
| 7,160,753 B2 | 1/2007 | Williams, Jr. | |
| 7,186,586 B2 | 3/2007 | Savastiouk et al. | |
| 7,192,796 B2 | 3/2007 | Zilber et al. | |
| 7,193,239 B2 | 3/2007 | Leedy | |
| 7,208,343 B2 | 4/2007 | Song et al. | |
| 7,208,345 B2 | 4/2007 | Meyer et al. | |
| 7,215,018 B2 | 5/2007 | Vindasius et al. | |
| 7,241,641 B2 | 7/2007 | Savastiouk et al. | |
| 7,241,675 B2 | 7/2007 | Savastiouk et al. | |
| 7,285,865 B2 | 10/2007 | Kwon et al. | |
| 7,312,521 B2 * | 12/2007 | Noma et al. | 257/698 |
| 7,394,152 B2 | 7/2008 | Yu et al. | |
| 7,408,249 B2 | 8/2008 | Badihi | |
| 7,474,004 B2 | 1/2009 | Leedy | |
| 7,495,316 B2 | 2/2009 | Kirby et al. | |
| 7,498,661 B2 * | 3/2009 | Matsuo | 257/621 |
| 7,504,732 B2 | 3/2009 | Leedy | |
| 7,510,928 B2 | 3/2009 | Savastiouk et al. | |
| 7,521,360 B2 | 4/2009 | Halahan et al. | |
| 7,622,810 B2 * | 11/2009 | Takao | 257/774 |
| 7,662,670 B2 | 2/2010 | Noma et al. | |
| 7,662,710 B2 | 2/2010 | Shiv | |
| 7,663,213 B2 | 2/2010 | Yu et al. | |
| 7,705,466 B2 | 4/2010 | Leedy | |
| 7,759,166 B2 | 7/2010 | Haba et al. | |
| 7,829,438 B2 | 11/2010 | Haba et al. | |
| 7,858,512 B2 * | 12/2010 | Marcoux | 438/612 |
| 7,859,115 B2 * | 12/2010 | Kim et al. | 257/774 |
| 7,884,459 B2 | 2/2011 | Yoshida et al. | |
| 7,901,989 B2 | 3/2011 | Haba et al. | |
| 7,944,015 B2 | 5/2011 | Kitagawa et al. | |
| 7,952,195 B2 | 5/2011 | Haba | |
| 7,973,416 B2 * | 7/2011 | Chauhan | 257/777 |
| 8,022,527 B2 | 9/2011 | Haba et al. | |
| 8,043,895 B2 | 10/2011 | Haba et al. | |
| 8,044,516 B2 * | 10/2011 | Park | 257/772 |
| 8,076,788 B2 * | 12/2011 | Haba et al. | 257/786 |
| 8,193,615 B2 * | 6/2012 | Haba et al. | 257/621 |
| 2001/0024839 A1 | 9/2001 | Lin | |
| 2001/0048151 A1 | 12/2001 | Chun | |
| 2002/0047199 A1 | 4/2002 | Ohuchi et al. | |
| 2002/0074637 A1 | 6/2002 | McFarland | |
| 2002/0109236 A1 | 8/2002 | Kim et al. | |
| 2002/0113303 A1 | 8/2002 | Murayama | |
| 2002/0127775 A1 | 9/2002 | Haba et al. | |
| 2002/0132465 A1 | 9/2002 | Leedy | |
| 2002/0171145 A1 | 11/2002 | Higuchi et al. | |
| 2003/0006494 A1 | 1/2003 | Lee et al. | |
| 2003/0060034 A1 | 3/2003 | Beyne et al. | |
| 2003/0094683 A1 | 5/2003 | Poo et al. | |
| 2003/0096454 A1 | 5/2003 | Poo et al. | |
| 2003/0173608 A1 | 9/2003 | Leedy | |
| 2003/0209772 A1 | 11/2003 | Prabhu | |
| 2003/0233704 A1 | 12/2003 | Castellote | |
| 2004/0014255 A1 | 1/2004 | Grigg et al. | |
| 2004/0016942 A1 | 1/2004 | Miyazawa et al. | |
| 2004/0070063 A1 | 4/2004 | Leedy | |
| 2004/0082114 A1 | 4/2004 | Horng | |
| 2004/0104454 A1 | 6/2004 | Takaoka et al. | |
| 2004/0142509 A1 | 7/2004 | Imai | |
| 2004/0155326 A1 | 8/2004 | Kanbayashi | |

| | | |
|---|---|---|
| 2004/0155354 A1 | 8/2004 | Hanaoka et al. |
| 2004/0169278 A1 | 9/2004 | Kinsman |
| 2004/0221451 A1 | 11/2004 | Chia et al. |
| 2004/0222508 A1 | 11/2004 | Aoyagi |
| 2004/0251525 A1 | 12/2004 | Zilber et al. |
| 2005/0003649 A1 | 1/2005 | Takao |
| 2005/0012225 A1 | 1/2005 | Choi et al. |
| 2005/0046002 A1 | 3/2005 | Lee et al. |
| 2005/0051883 A1* | 3/2005 | Fukazawa ............... 257/686 |
| 2005/0056903 A1 | 3/2005 | Yamamoto et al. |
| 2005/0067680 A1 | 3/2005 | Boon et al. |
| 2005/0073035 A1 | 4/2005 | Moxham |
| 2005/0095835 A1 | 5/2005 | Humpston et al. |
| 2005/0104179 A1 | 5/2005 | Zilber et al. |
| 2005/0156330 A1 | 7/2005 | Harris |
| 2005/0260794 A1 | 11/2005 | Lo et al. |
| 2005/0263866 A1 | 12/2005 | Wan |
| 2005/0287783 A1 | 12/2005 | Kirby et al. |
| 2006/0006488 A1 | 1/2006 | Kanbe |
| 2006/0017161 A1 | 1/2006 | Chung et al. |
| 2006/0043556 A1 | 3/2006 | Su et al. |
| 2006/0043598 A1 | 3/2006 | Kirby et al. |
| 2006/0043601 A1 | 3/2006 | Pahl |
| 2006/0046348 A1 | 3/2006 | Kang |
| 2006/0046471 A1 | 3/2006 | Kirby et al. |
| 2006/0055050 A1 | 3/2006 | Numata et al. |
| 2006/0055061 A1 | 3/2006 | Hosokawa et al. |
| 2006/0068580 A1 | 3/2006 | Dotta |
| 2006/0076670 A1 | 4/2006 | Lim et al. |
| 2006/0079019 A1 | 4/2006 | Kim |
| 2006/0094165 A1 | 5/2006 | Hedler et al. |
| 2006/0115932 A1 | 6/2006 | Farnworth et al. |
| 2006/0138626 A1 | 6/2006 | Liew et al. |
| 2006/0175697 A1 | 8/2006 | Kurosawa et al. |
| 2006/0220234 A1 | 10/2006 | Honer et al. |
| 2006/0220262 A1 | 10/2006 | Meyer et al. |
| 2006/0249829 A1 | 11/2006 | Katagiri et al. |
| 2006/0258044 A1 | 11/2006 | Meyer et al. |
| 2006/0292866 A1 | 12/2006 | Borwick et al. |
| 2007/0007556 A1 | 1/2007 | Shibayama |
| 2007/0035001 A1 | 2/2007 | Kuhmann et al. |
| 2007/0037379 A1 | 2/2007 | Enquist et al. |
| 2007/0045803 A1 | 3/2007 | Ye et al. |
| 2007/0045862 A1 | 3/2007 | Corisis et al. |
| 2007/0052050 A1 | 3/2007 | Dierickx |
| 2007/0102802 A1 | 5/2007 | Kang et al. |
| 2007/0126085 A1 | 6/2007 | Kawano et al. |
| 2007/0132082 A1 | 6/2007 | Tang et al. |
| 2007/0148941 A1 | 6/2007 | Haba et al. |
| 2007/0158807 A1 | 7/2007 | Lu et al. |
| 2007/0181989 A1 | 8/2007 | Corisis et al. |
| 2007/0190747 A1 | 8/2007 | Humpston et al. |
| 2007/0249095 A1 | 10/2007 | Song et al. |
| 2007/0257350 A1 | 11/2007 | Lee et al. |
| 2008/0083976 A1 | 4/2008 | Haba et al. |
| 2008/0083977 A1 | 4/2008 | Haba et al. |
| 2008/0090333 A1 | 4/2008 | Haba et al. |
| 2008/0099900 A1 | 5/2008 | Oganesian et al. |
| 2008/0099907 A1 | 5/2008 | Oganesian et al. |
| 2008/0116544 A1 | 5/2008 | Grinman et al. |
| 2008/0116545 A1 | 5/2008 | Grinman et al. |
| 2008/0122113 A1 | 5/2008 | Corisis et al. |
| 2008/0157327 A1 | 7/2008 | Yang |
| 2008/0166836 A1 | 7/2008 | Jobetto |
| 2008/0246136 A1 | 10/2008 | Haba et al. |
| 2008/0284041 A1 | 11/2008 | Jang et al. |
| 2008/0308921 A1 | 12/2008 | Kim |
| 2008/0315407 A1 | 12/2008 | Andrews, Jr. et al. |
| 2009/0009491 A1 | 1/2009 | Grivna |
| 2009/0032966 A1 | 2/2009 | Lee et al. |
| 2009/0039528 A1 | 2/2009 | Haba et al. |
| 2009/0065907 A1 | 3/2009 | Haba et al. |
| 2009/0067135 A1 | 3/2009 | Hirai |
| 2009/0067210 A1 | 3/2009 | Leedy |
| 2009/0121323 A1* | 5/2009 | Kwon et al. ............... 257/621 |
| 2009/0160065 A1 | 6/2009 | Haba et al. |
| 2009/0166840 A1* | 7/2009 | Kang et al. ............... 257/686 |
| 2009/0166846 A1* | 7/2009 | Pratt et al. ............... 257/698 |
| 2009/0174082 A1 | 7/2009 | Leedy |
| 2009/0175104 A1 | 7/2009 | Leedy |
| 2009/0212381 A1 | 8/2009 | Crisp et al. |
| 2009/0218700 A1 | 9/2009 | Leedy |
| 2009/0219742 A1 | 9/2009 | Leedy |
| 2009/0219743 A1 | 9/2009 | Leedy |
| 2009/0219744 A1 | 9/2009 | Leedy |
| 2009/0219772 A1 | 9/2009 | Leedy |
| 2009/0230501 A1 | 9/2009 | Leedy |
| 2009/0309235 A1 | 12/2009 | Suthiwongsunthorn et al. |
| 2009/0316378 A1 | 12/2009 | Haba et al. |
| 2010/0053407 A1 | 3/2010 | Crisp et al. |
| 2010/0065949 A1* | 3/2010 | Thies et al. ............... 257/621 |
| 2010/0164086 A1 | 7/2010 | Noma et al. |
| 2010/0200966 A1 | 8/2010 | Karnezos |
| 2010/0219523 A1 | 9/2010 | Chow et al. |
| 2010/0225006 A1 | 9/2010 | Haba et al. |
| 2010/0230795 A1 | 9/2010 | Kriman et al. |
| 2011/0006432 A1 | 1/2011 | Haba et al. |
| 2011/0024890 A1 | 2/2011 | Yang et al. |
| 2011/0039370 A1 | 2/2011 | Gomyo et al. |
| 2011/0198722 A1* | 8/2011 | Suh ............... 257/529 |
| 2011/0248410 A1 | 10/2011 | Avsian et al. |
| 2012/0025364 A1 | 2/2012 | Hoshino et al. |

FOREIGN PATENT DOCUMENTS

| | | |
|---|---|---|
| DE | 102004039906 A1 | 8/2005 |
| EP | 0926723 A1 | 6/1999 |
| EP | 1041624 A1 | 10/2000 |
| EP | 1482553 A2 | 12/2004 |
| EP | 1519410 A1 | 3/2005 |
| EP | 1619722 A1 | 1/2006 |
| EP | 1653510 A2 | 5/2006 |
| EP | 1686627 A1 | 8/2006 |
| EP | 1 741 668 A2 | 1/2007 |
| EP | 1801866 A2 | 6/2007 |
| FR | 2704690 A1 | 11/1994 |
| JP | 60160645 A | 8/1985 |
| JP | 07-509104 A | 10/1995 |
| JP | 08306724 A | 11/1996 |
| JP | 09045848 A | 2/1997 |
| JP | 2001035995 A | 2/2001 |
| JP | 2001-217386 A | 8/2001 |
| JP | 2002093944 A | 3/2002 |
| JP | 2003-037758 A | 2/2003 |
| JP | 2003208655 A | 7/2003 |
| JP | 2004063569 A | 2/2004 |
| JP | 2005101067 A | 4/2005 |
| JP | 2005303031 A | 10/2005 |
| KR | 2006-0020822 A | 3/2006 |
| TW | I289936 | 4/2004 |
| WO | 9425987 A1 | 11/1994 |
| WO | 9845130 A1 | 10/1998 |
| WO | 9940624 A1 | 8/1999 |
| WO | 2004/025727 A1 | 3/2004 |
| WO | 2004114397 | 12/2004 |
| WO | 2005081315 A2 | 9/2005 |
| WO | 2007066409 A1 | 6/2007 |
| WO | 2009017758 A2 | 2/2009 |
| WO | 2009017835 A2 | 2/2009 |
| WO | 2009023462 A1 | 2/2009 |

OTHER PUBLICATIONS

Chinese Office Action and Search Report for Application 200980122523 dated Aug. 20, 2012.
English translation of Japanese Office Action for 2011-554055 dated Mar. 25, 2012.
International Search Report and Written Opinion from PCT/US2010/000777, dated Nov. 19, 2010.
U.S. Appl. No. 61/030,463, filed Feb. 21, 2008.
U.S. Appl. No. 61/061,953, filed Jun. 16, 2008.
U.S. Appl. No. 60/962,200, filed Jul. 27, 2007.
U.S. Appl. No. 60/936,617, filed Jun. 20, 2007.
International Search Report, PCT/US2007/021552.
International Search Report, PCT/US2008/009353.
U.S. Appl. No. 60/850,850, filed Oct. 10, 2006.
U.S. Appl. No. 11/582,186, filed Oct. 17, 2006.
U.S. Appl. No. 60/963,209, filed Aug. 3, 2007.

International Search Report, PCT/US08/09207, dated Jan. 16, 2009.
U.S. Appl. No. 60/964,069, filed Aug. 9, 2007.
U.S. Appl. No. 11/704,713, filed Feb. 9, 2007.
Bang, U.S. Appl. No. 60/030,463, filed Sep. 6, 2002.
International Search Report, PCT/US2009/003643, dated Aug. 28, 2009.
Partial International Search Report, PCT/US2008/002659.
International Search Report, PCT/US2008/002659.
U.S. Appl. No. 12/143,743, "Recontituted Wafer Level Stacking", filed Jun. 20, 2008.
U.S. Appl. No. 11/590,616, filed Oct. 31, 2006.
U.S. Appl. No. 11/789,694, filed Apr. 25, 2007.
PCT/US08/09207, "Reconstituted Wafer Stack Packaging With After Applied Pad Extensions," filed Jul. 25, 2008.
International Search Report, PCT/US2008/009356.
International Search Report, PCT/US2008/010746, date May 27, 2009.
U.S. Appl. No. 12/723,039, filed Mar. 12, 2010.
U.S. Appl. No. 12/456,349, filed Jun. 15, 2009.
U.S. Appl. No. 12/670,952, filed May 14, 2010.
U.S. Appl. No. 12/671,993, filed Jul. 16, 2010.
U.S. Appl. No. 12/784,841, filed May 21, 2010.
Communication from PCT/US2010/000777, dated Aug. 5, 2010.
International Search Report, PCT/US07/26095.
Office Action from Chinese Application No. 2007800504745 dated Jul. 8, 2010.
International Search Report from PCT/US2010/000777, dated Nov. 19, 2010.
Office Action from U.S. Appl. No. 11/704,713 mailed Mar. 1, 2011.
Office Action from U.S. Appl. No. 12/908,227 mailed Apr. 5, 2011.
Response to Office Action from U.S. Appl. No. 12/908,227 mailed Apr. 5, 2011.

* cited by examiner

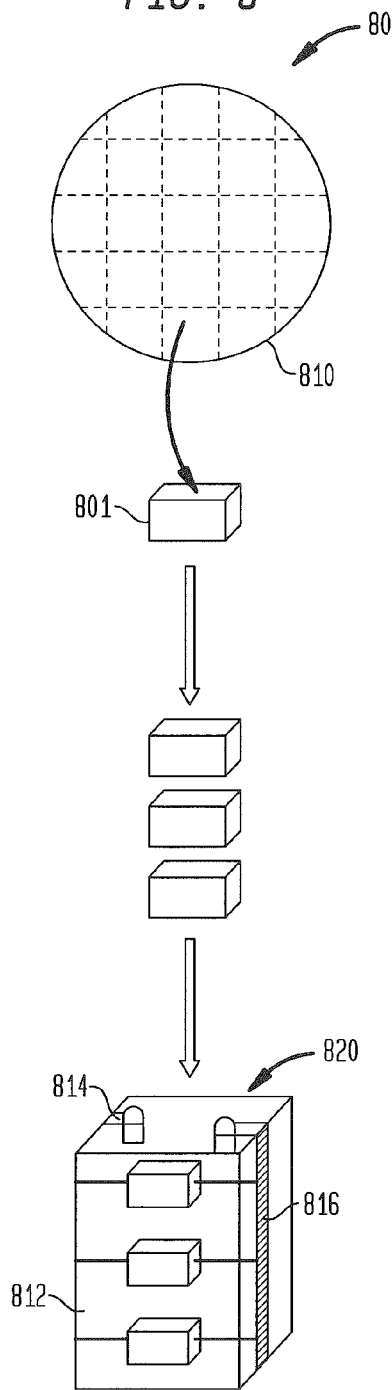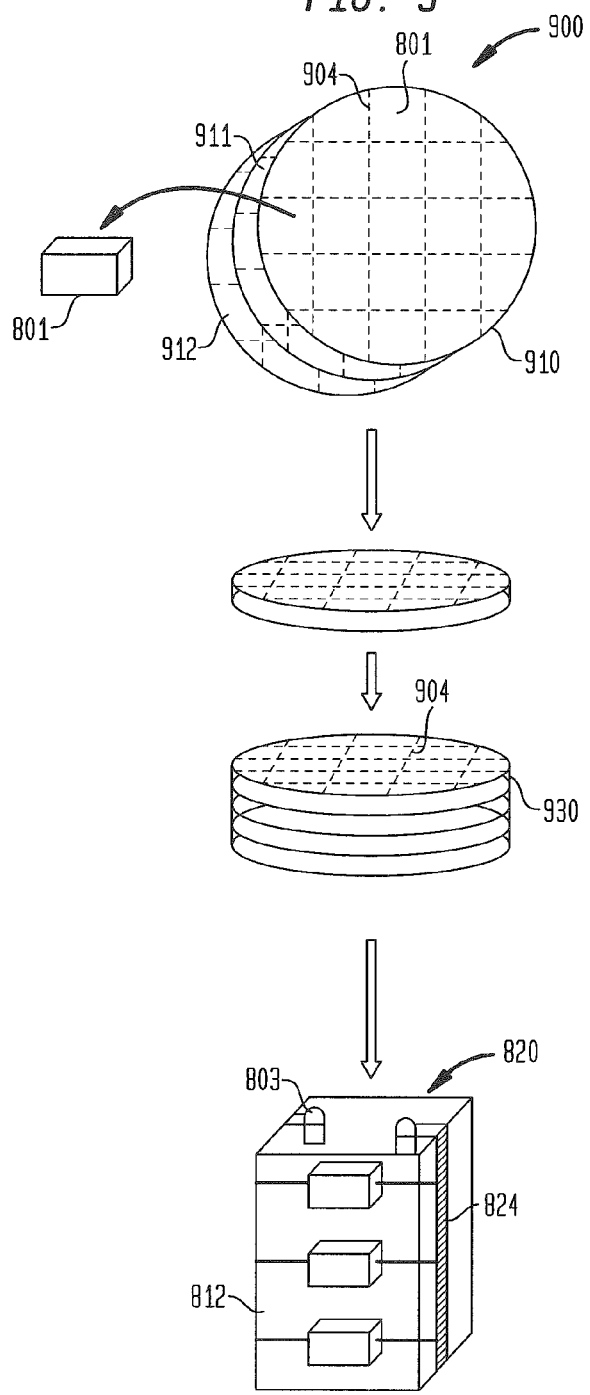

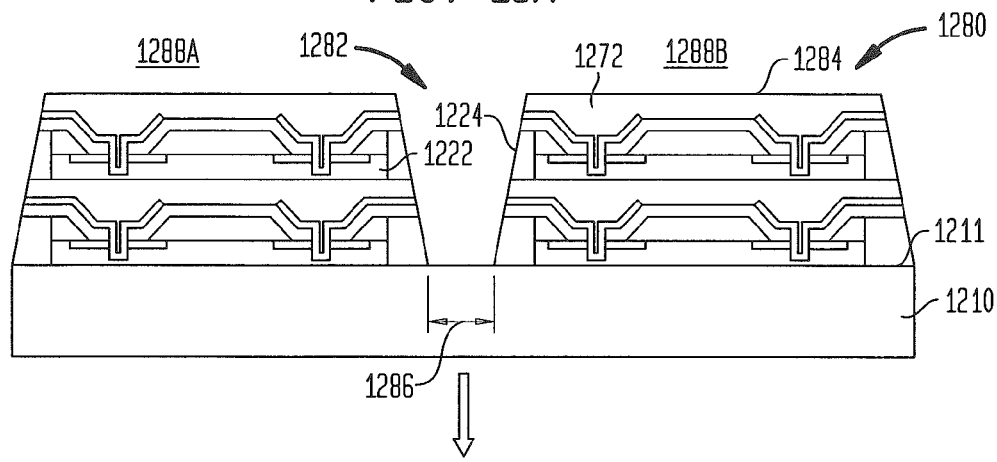
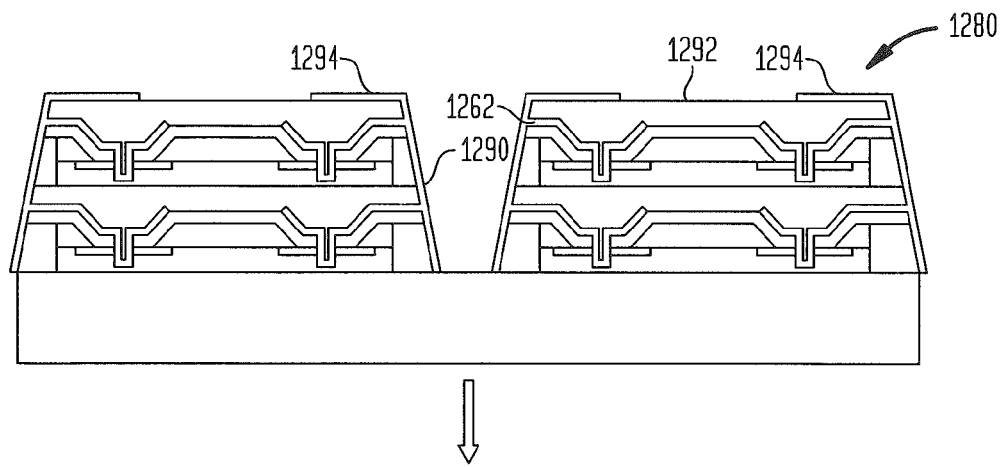
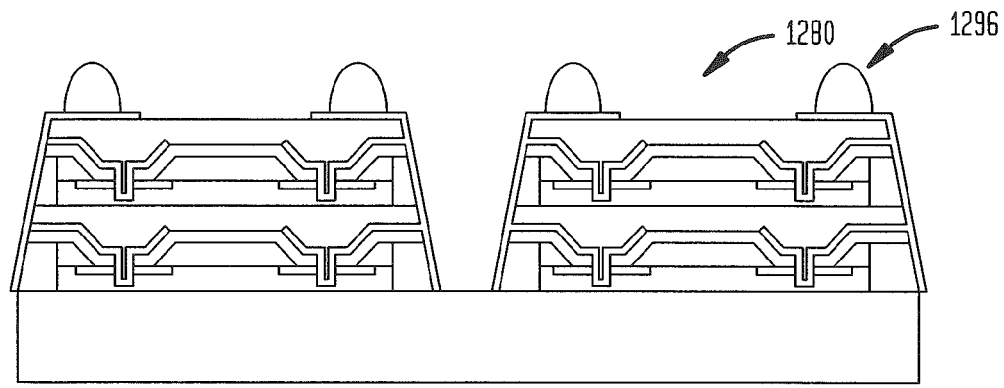

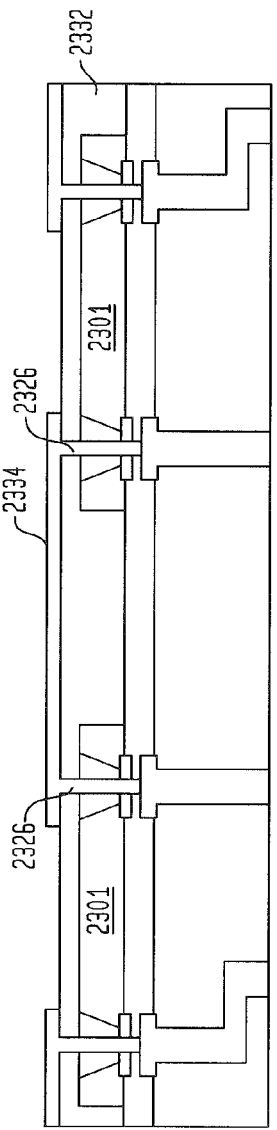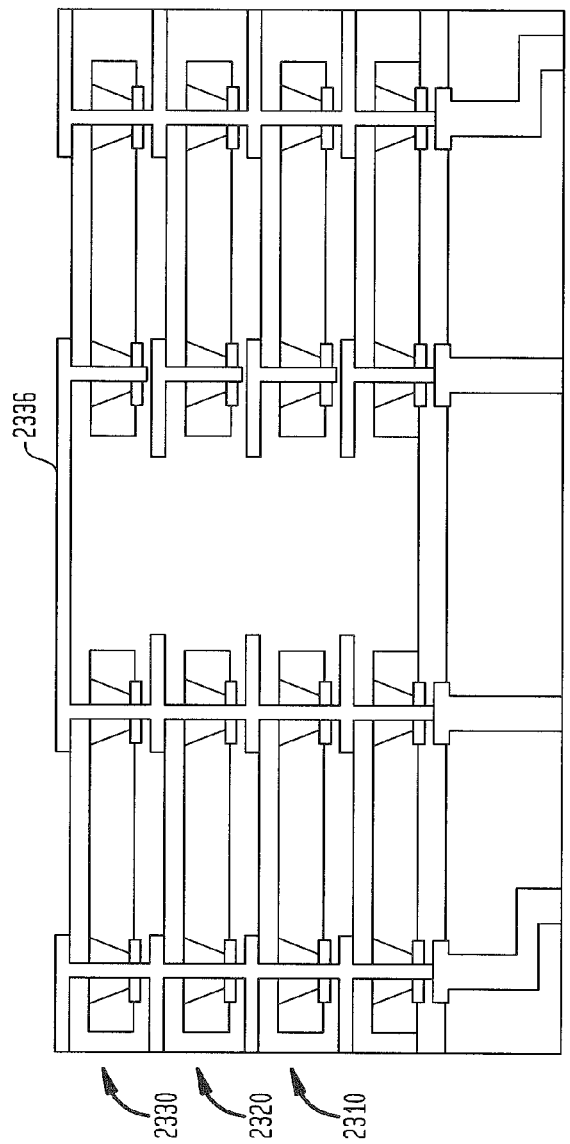

STACKED MICROELECTRONIC ASSEMBLIES HAVING VIAS EXTENDING THROUGH BOND PADS

CROSS-REFERENCE TO RELATED APPLICATIONS

This application claims the benefit of the filing date of U.S. Provisional Patent Application No. 61/210,100 filed Mar. 13, 2009, the disclosure of which is hereby incorporated herein by reference.

BACKGROUND OF THE INVENTION

The subject matter of the present application relates to packaged microelectronic elements and methods of fabricating them, including microelectronic assemblies having stacked die.

Microelectronic chips, e.g., semiconductor chips are typically flat bodies with oppositely facing, generally planar front and rear surfaces and with edges extending between these surfaces. Chips generally have contacts, sometimes also referred to as pads or bond pads, on the front surface which are electrically connected to the circuits within the chip. Chips are typically packaged by enclosing them with a suitable material to form microelectronic packages having terminals that are electrically connected to the chip contacts. The package may then be connected to test equipment to determine whether the packaged device conforms to a desired performance standard. Once tested, the package may be connected to a larger circuit, e.g., a circuit in an electronic product such as a computer or a cell phone, by connecting the package terminals to matching lands on a printed circuit board (PCB) by a suitable connection method such as soldering.

Microelectronic packages may be fabricated at the wafer level; that is, the enclosure, terminations and other features that constitute the package, are fabricated while the chips, or die, are still in a wafer form. After the die have been formed, the wafer is subject to a number of additional process steps to form the package structure on the wafer, and the wafer is then diced to free the individually packaged die. Wafer level processing may be a preferred fabrication method because it may provide a cost savings advantage, and because the footprint of each die package may be made identical, or nearly identical, to the size of the die itself, resulting in very efficient utilization of area on the printed circuit board to which the packaged die is attached. A die packaged in this manner is commonly referred to as wafer-level chip scale package or wafer-level chip sized package (WLCSP).

In order to save additional space on the substrate to which a packaged die is mounted, multiple chips may be combined in a single package by vertically stacking them. Each die in the stack must typically provide an electrical connection mechanism to either one or more other die in the stack, or to the substrate on which the stack is mounted, or to both. This allows the vertically stacked multiple die package to occupy a surface area on a substrate that is less than the total surface area of all the chips in the package added together.

SUMMARY OF THE INVENTION

In accordance with an aspect of the invention, a stacked microelectronic assembly is provided which includes first and second microelectronic elements each having a front face, a bond pad on the front face, a rear face remote from the front face, and edges extending between the front and rear faces. The microelectronic elements can be stacked such that the front face of the first microelectronic element is adjacent one of the front or rear faces of the second microelectronic element. A face of the microelectronic assembly can overlie the faces of each of the first and second microelectronic elements. Each of the first and second microelectronic elements can include a conductive layer extending along a face of such microelectronic element. At least one of the first and second microelectronic elements can include: a recess extending from the rear surface towards the front surface, and a conductive via extending from the recess through the bond pad and electrically connected to the bond pad, wherein the conductive layer of the at least one microelectronic element is electrically connected to the via.

A plurality of leads can extend from the conductive layers of the first and second microelectronic elements, and a plurality of terminals of the assembly can be electrically connected with the leads.

Typically, the conductive via includes a conductive layer lining a hole extending through the bond pad, wherein the dielectric layer overlies the conductive layer within the hole. In one embodiment, an entire area of the via in a direction of the metallic pad is enclosed within an area of the bond pad.

In accordance with one or more particular embodiments, the leads can extend onto the face of the assembly and the terminals can be exposed at the face of the assembly. The microelectronic assembly can have at least one edge surface extending away from the face, where each edge surface extends along the edges of the first and second microelectronic elements, and the leads extend along the at least one edge surface and onto the face of the assembly.

In a particular embodiment, the microelectronic assembly may have an opening extending through at least one of the first and second microelectronic elements, and the leads can extend along a surface of the at least one opening.

In an embodiment, each of the first and second microelectronic elements can include a recess and a conductive via extending therefrom through a bond pad of such microelectronic element, the conductive layer of such microelectronic element being electrically connected to the via of such microelectronic element.

In a particular embodiment, the first microelectronic element includes the recess and the conductive via, and the conductive layer of such microelectronic element is electrically connected to the via of such microelectronic element. In such embodiment, the conductive layer of the second microelectronic element can electrically contact a surface of the bond pad thereof, wherein the surface extends along the front face of the second microelectronic element.

In a particular embodiment, the conductive layer of the at least one microelectronic element extends conformally along a surface of the recess, and the assembly can further include a dielectric layer overlying the conductive layer within the recess.

In a particular embodiment, the microelectronic assembly may further include dielectric layers having surfaces extending beyond the edges of the microelectronic elements, wherein the conductive layers extend in a first direction along the surfaces of the dielectric layers beyond the edges. In one embodiment, at least one of the leads can include a portion extending in a first direction along the portion of at least one of the conductive layers, the lead portion electrically contacting the conductive layer portion. The at least one lead can be a first lead, and at least one second lead can include a conductive via extending through the lead portion and the conductive layer portion.

In a particular embodiment, the recess can be a first recess, and the edge of the at least one microelectronic element can include a second recess, wherein the conductive layer extends along a surface of the second recess. The conductive layers can further extend onto major surfaces of dielectric layers beyond the second recesses.

In a particular embodiment, the microelectronic assembly can further include a transparent lid mounted above a face of the first microelectronic element, wherein the first microelectronic element includes an image sensor aligned with the transparent lid. The assembly further may further include a cavity disposed between the face and the lid, the image sensor being aligned with the cavity.

Alternatively, the assembly may include a lid mounted above a face of the first microelectronic element, and a cavity disposed between the front face and the lid, wherein the first microelectronic element includes a micro-electromechanical system ("MEMS") device aligned with the cavity.

In one embodiment, walls of a recess in a die oriented at a normal (90°) angle with respect to a front surface of that die.

In accordance with a particular embodiment, the recess can be tapered, becoming smaller with increasing distance from the rear surface. In such embodiment, walls of the recess can be oriented at an angle of about 5 degrees or greater with respect to a normal to the rear surface. In one embodiment, the walls can be oriented at an angle of less than or equal to about 40 degrees with respect to a normal to the rear surface.

In accordance with a particular embodiment, a dielectric layer can contact the bond pad within the recess, and the conductive via can extend through the dielectric layer and the bond pad. An entire area of the via in a direction along a major surface of the bond pad can be enclosed within an area of the major surface of the bond pad.

In accordance with another aspect of the invention, a microelectronic assembly is provided which includes a dielectric element having a face and a conductive pad on the face. A microelectronic element having a front face, a metallic pad on the front face, a rear face remote from the front face, and a recess extending from the rear surface towards the front surface can be mounted on the dielectric element such that the metallic pad is adjacent to and aligned with the conductive pad. A conductive via can extend through the recess and the metallic pad and electrically contact the conductive pad of the substrate.

In a particular embodiment, the face of the dielectric element is a first face, and the dielectric element can further include a second face remote from the first face and a terminal on the second face electrically connected with the metallic pad.

The conductive via can further include a metal layer, and the metal layer can conform to a surface of the metallic pad exposed within a hole extending through the metallic pad.

In a particular embodiment, the microelectronic element can be a first microelectronic element, and the conductive via can be a first conductive via. The first microelectronic element can include an edge extending between the front and rear faces, and the microelectronic assembly may further include a conductive element extending from the conductive via above the rear face towards the edge. In such embodiment, the microelectronic assembly further includes a second microelectronic element having a front face, a second metallic pad on the front face, and a rear face remote from the front face, the second microelectronic element being mounted on the dielectric element adjacent the edge of the first microelectronic element. The microelectronic assembly may further include a conductive element electrically connected to the conductive via which extends along the rear face of the first microelectronic element and electrically connects to the second metallic pad.

Alternatively, in a microelectronic assembly, the microelectronic element can be a first microelectronic element and the conductive via can be a first conductive via. The first microelectronic element can include an edge extending between the front and rear faces, and the microelectronic assembly can further include a conductive element extending from the conductive via above the rear face towards the edge. The microelectronic assembly may further include a second microelectronic element having a front face, a second metallic pad on the front face, and a rear face remote from the front face, the second microelectronic element including a second recess extending from the rear face towards the front face of the second microelectronic element. The second microelectronic element can be mounted above the rear face of the first microelectronic element such that the second metallic pad faces the conductive pad. The microelectronic assembly can further include a second conductive via extending through the second recess and the second metallic pad and electrically contacting the conductive pad.

An edge surface of the microelectronic assembly can extend along edges of the first and second microelectronic elements. A lead can be connected to the conductive element which extends along the edge surface. The microelectronic assembly may further include a terminal exposed at a face of the dielectric element remote from the conductive pad, and the terminal can be electrically connected to the lead.

In a particular embodiment, the microelectronic assembly has a first face overlying the front face of the first microelectronic element, and a second face overlying the rear face of the second microelectronic element, the microelectronic assembly further comprising an opening extending between the first and second faces and a conductor within the opening electrically connected to the conductive element.

In accordance with another embodiment, a method is provided for forming a microelectronic assembly having a plurality of stacked microelectronic elements therein. The method can include forming a plurality of subassemblies. Each subassembly can be formed by a common set of steps. For example, a microelectronic element can be bonded to a carrier such that a plurality of metallic pads exposed at a front surface of the microelectronic element confront the carrier. A recess can be formed which extends from a rear face of a microelectronic element towards the metallic pad exposed at a front face of the microelectronic element. A dielectric layer can be deposited onto the rear face and into the recess. A hole can be formed which extends through the dielectric layer and through the metallic pad within the recess. A conductive layer can be formed overlying the dielectric layer which extends along the rear surface and within the hole, the conductive layer being electrically connected to the metallic pad.

The plurality of subassemblies can then be stacked in at least approximate alignment, with the carrier between at least adjacent subassemblies optionally removed. Leads and terminals can then be formed which are electrically connected to the conductive layers of the each of the microelectronic elements.

In accordance with another embodiment, a method is provided for forming a microelectronic package. Such method can include forming a recess extending from a rear face of a microelectronic element towards a metallic pad exposed at a front face of the microelectronic element A dielectric layer can be formed onto the rear face and into the recess. The dielectric layer can then be patterned overlying the rear face. A hole can be formed which extends through the dielectric material and through the metallic pad. A conductive layer can be formed overlying the dielectric layer and extending along the rear surface and within the hole, the conductive layer being electrically connected to the metallic pad.

In accordance with another embodiment of the invention, a method is provided of forming a plurality of microelectronic assemblies. The method can include forming a plurality of subassemblies. Each subassembly can be formed by a common set of steps. For example, a plurality of first microelectronic elements can be mounted atop a dielectric element, each first microelectronic element having a front face adjacent the dielectric element and a plurality of metallic pads exposed at the front face. Recesses can be formed which extend from rear faces of the first microelectronic elements towards the front faces. A dielectric layer can be formed between edges of the first microelectronic elements, the dielectric layer extending onto the rear faces of the first microelectronic elements and into the recesses. Through holes can be formed which extend from the recesses through the metallic pads. Conductive elements can be formed which extend within the recesses and the through holes and along the rear surfaces of the first microelectronic elements towards edges of the first microelectronic elements, the conductive elements electrically contacting the metallic pads within the through holes.

The plurality of subassemblies can then be stacked in at least approximate alignment, with the carrier between at least adjacent subassemblies optionally removed. Leads and terminals can then be formed which are electrically connected to the conductive layers of the each of the microelectronic elements.

The dielectric element can be severed with the first and second microelectronic elements thereon along edges of the microelectronic elements into individual stacked microelectronic assemblies, each microelectronic assembly including terminals electrically connected to the metallic pads of the first and second microelectronic elements therein.

BRIEF DESCRIPTION OF THE DRAWINGS

The devices and methods described herein are best understood when the following description of several illustrated embodiments is read in connection with the accompanying drawings wherein the same reference numbers are used throughout the drawings to refer to the same or like parts. The drawings are not necessarily to scale; emphasis has instead been placed upon illustrating the principles of the described embodiments.

The structure and methods of fabrication of the microelectronic devices described herein are best understood when the following description of several illustrated embodiments is read in connection with the accompanying drawings wherein the same reference numbers are used throughout the drawings to refer to the same or like parts. The drawings are not necessarily to scale; emphasis has instead been placed upon illustrating the structural and fabrication principles of the described embodiments. The drawings include:

FIG. 8 diagrammatically illustrates a first embodiment of a process for fabricating a die stacked package as illustrated herein.

FIG. 9 diagrammatically illustrates a second embodiment of a process for fabricating a die stacked package as illustrated herein.

FIGS. 15A-C illustrate stages in processing according to the sub-processes of FIG. 11B.

FIGS. 23A-C are sectional views illustrating a process of fabricating microelectronic packages containing a plurality of stacked die therein in accordance with a particular embodiment.

DETAILED DESCRIPTION

As used in this disclosure, a contact, bond pad or other conductive element "exposed at" a surface of a dielectric element may be flush with such surface; recessed relative to such surface; or protruding from such surface, so long as the contact, bond pad, or other conductive element is accessible by a theoretical point moving towards the surface in a direction perpendicular to the surface.

For clarity, the bond pads 106 are shown visible above the surface of the substrate 102, but the bond pads might also be flush with the surface or even below the surface. The embodiments described herein are examples of die stacked packages. As used herein, a "die stacked package" is a single microelectronic package containing multiple microelectronic elements (for example, semiconductor chips or die) within the package. This is in contrast to a "stacked die package" which is defined herein as a stack of individually packaged microelectronic elements. A "stacked die package" is an assembly including a plurality of individual packages containing microelectronic elements are joined together in a stack, in which external terminals of at least one packaged microelectronic element are electrically connected with the external terminals of at least one other packaged microelectronic element.

Figure 1A:
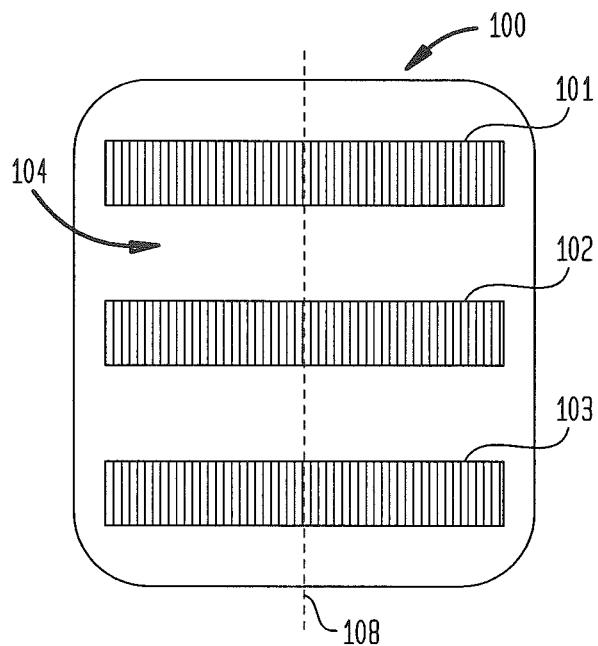
FIG. 1A is a simplified illustration of a die stacked package in which multiple discrete die are packaged in one enclosure.
Figure 1B:
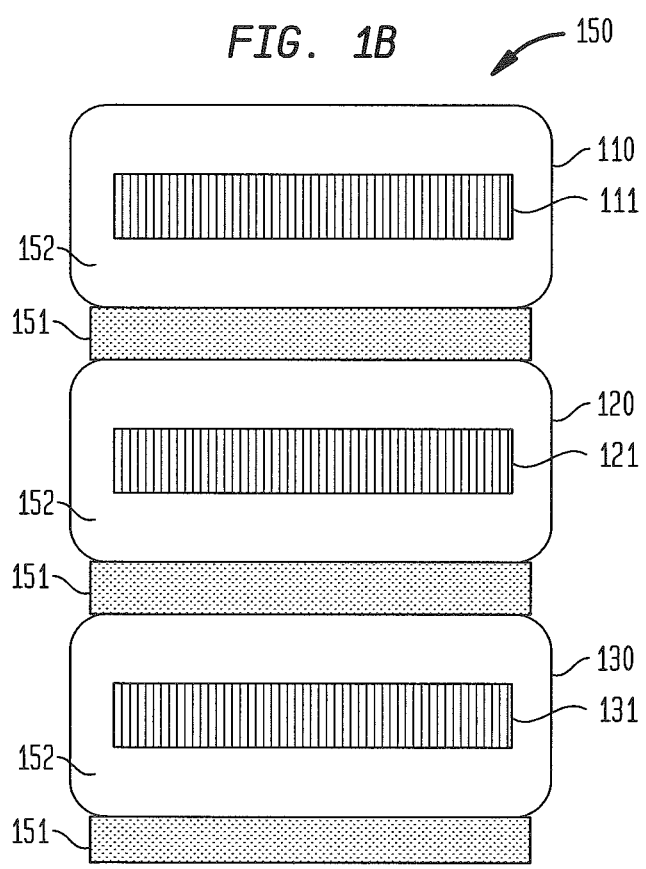
FIG. 1B is a simplified illustration of a stacked die package in which multiple discrete chip scale packages die are joined together in a vertical stack.

FIGS. 1A and 1B illustrate the difference between a die stacked package and a stacked die package. Note that details such as electrical connections between or among individual die and between a microelectronic package and other packages or substrates are omitted for purposes of illustration. In FIG. 1A, die stacked package 100 is a single entity that contains by way of example three die, 101, 102 and 103 arranged vertically one on top of another surrounded by unitary enclosure 104. The die stacked package can have an encapsulant or other structure protecting the microelectronic elements as a unit, and typically has a set of terminals (not shown) exposed at an exterior of the package through which electrical connections can be made to the microelectronic elements within the package. The example of three die shown in FIG. 1A is not intended to be limiting in any way; fewer or more die may be stacked in this manner.

FIG. 1B illustrates a stacked die package 150 i.e., an assembly containing a plurality of stacked and electrically connected packages, constructed from three discrete chip scale packages 110, 120 and 130. Each discrete chip scale package is surrounded by unitary enclosure 152. In FIG. 1B, chip scale package 120 is shown stacked and affixed by material 151 to chip scale package 130, and chip scale package 110 is shown stacked and affixed by material 151 to chip scale package 120 to collectively form the assembly of individual packages which make up the stacked die package 150. It can be seen from FIG. 1B that any number of discrete chip scale packages may be stacked in this manner. In FIG. 1B, each discrete chip scale package 110, 120 and 130 happens to contain a single die, 111, 121 and 131 respectively, but the term stacked die package as used herein is not limited to such an arrangement; each discrete chip scale package 110, 120 and 130 could also contain multiple die such as die stacked package 100.

Various practical product and design factors contribute to the selection of a die stacked package versus a stacked die package. Die stacked package 100 (FIG. 1A) may result in a physically more compact component because less material is used to form the package enclosure. Stacked die package 150 (FIG. 1B), when each discrete chip scale package contains a single die, may provide higher functional yield because each die may be fully tested as a functioning die (the concept referred to as "known good die") before committing the tested package to the stack.

Embodiments of a Die Stacked Package

Figure 2:
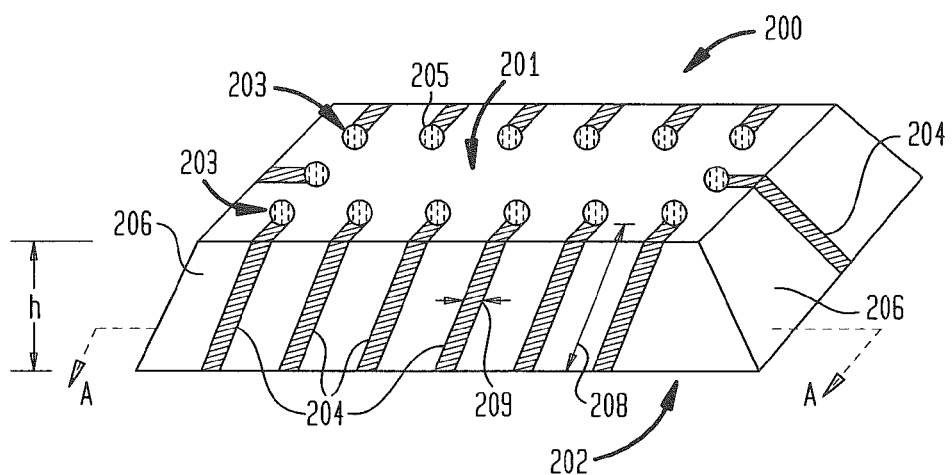
FIG. 2 is a perspective view of a first embodiment of a die stacked package containing multiple stacked die, as viewed by an observer looking toward a first (e.g., upper) surface of the package, and illustrating a first configuration of a redistribution layer.

FIG. 2 is a perspective view of a first embodiment of a die stacked package 200 as viewed from a first surface that is referred to herein as upper surface 201. Die stacked package 200 has oppositely facing, generally planar upper surface 201 and lower surface 202; lower surface 202 is not visible in this view. Edge surfaces 206 extend between the upper and lower surfaces 201, 202. At least some of the edge surfaces 206 can extend between the lower and upper surfaces at an inclined angle such that upper surface 201 can have smaller area than lower surface 202. In one embodiment, the inclined angle can be about 30 degrees from the perpendicular with respect to the lower surface. In a particular embodiment, the angle can range from 5 degrees to 40 degrees. The angle can be smaller or larger as necessary up to the physical limits of between 0 degrees from the perpendicular and 89.9 degrees.

The dimensions of die stacked package 200 may be determined by the contents of the package (e.g., the number of die stacked, the height of each stacked die, etc.), and thus may vary greatly. In one embodiment, the package dimensions can be several to tens of millimeters on a side, i.e., the length of the edge surface 206 where it meets the lower surface 202 of the package 200. In one embodiment, the die stacked package 200 is from less than a millimeter to just a few millimeters in height h, giving the package 200 the aspect ratio of a plate.

Die stacked package 200 has the capability to make electrical connection to other components. In the embodiment shown in FIG. 2, electrical connection to other components can be made through a ball grid array (BGA) interface 203 on upper face 201. As seen in FIG. 2, a BGA interface can contain an array of partial spheres 205 of solder exposed at an exterior face of the package 200. By suitable processing it is possible to simultaneously physically attach and electrically connect the spheres of the BGA interface of an electronic component such as die stack package 200 to corresponding terminals of a printed circuit board, or atop another substrate or component. Other embodiments of die stack package 200 not shown here may make use of a variety of other connection schemes in place of a BGA interface 203 that are well known to those skilled in the art, such as wire bonding and TAB (tape automated bonding).

As seen in FIG. 2, BGA interface 203 can be connected to other parts of the package by a redistribution layer (RDL) including conductive elements or conductive traces 204. The traces 204 can extend from terminals (not shown) underlying in alignment with the solder spheres of the BGA along the upper surface 201 and onto the edges, i.e., edge surfaces 206 of the package. In a particular example, the traces 204 have high aspect ratio; that is, each trace typically has a length 208 and a breadth (width) 209 much greater than the thickness of the trace extending in direction above surface 201. While traces 204 in FIG. 2 appears as a relatively uniform pattern of straight conductive areas, traces may also appear in less uniform patterns and may even have a serpentine appearance.

Figure 3:
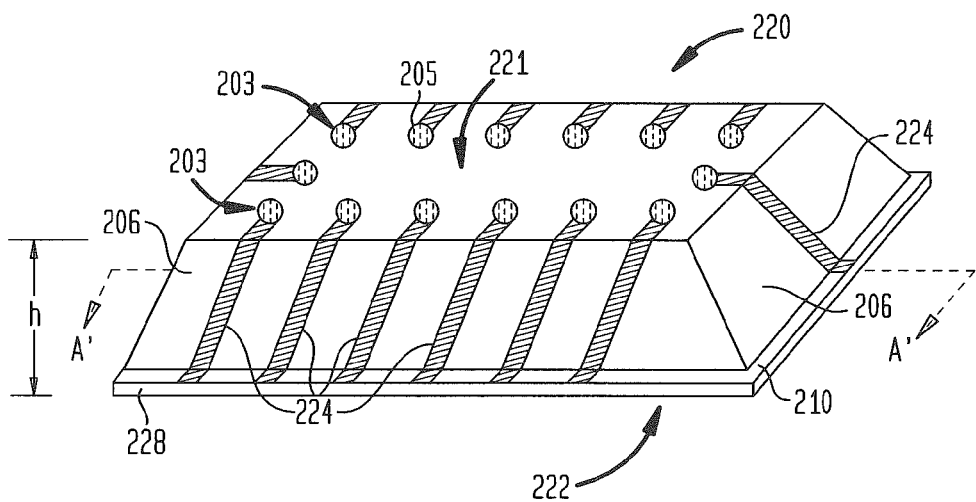
FIG. 3 is a perspective view of a second embodiment of a die stacked package containing multiple stacked die, as viewed by an observer looking toward a first (e.g., upper) surface of the package, and illustrating a slightly extended lower surface of the package.

FIG. 3 is a perspective view of a second embodiment of a die stacked package 220. Die stacked package 220 has a generally planar upper surface 221 and lower support structure 228; lower support structure 228 has lower surface 222 which oppositely faces upper surface 221. Die stacked package 220 is shown as viewed from upper surface 221 in FIG. 3. In the embodiment shown in FIG. 3, lower support structure 228 extends slightly beyond the edge surfaces 206. Traces 224 extend onto the upper face 210 of lower support structure 228 that extends slightly past edges 206.

Figure 4:
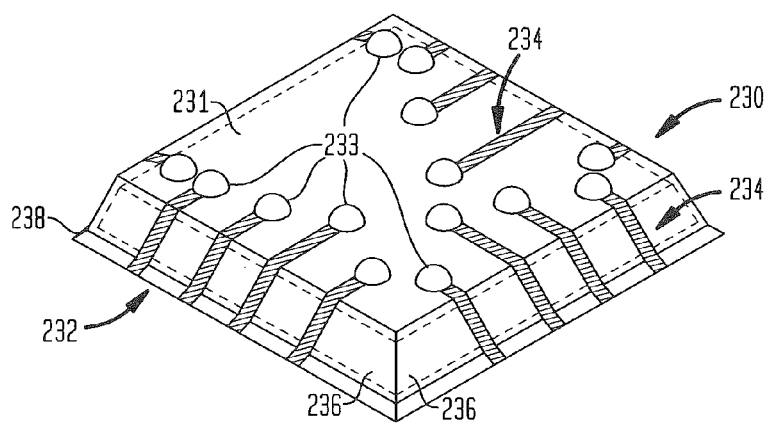
FIG. 4 is a perspective view of a third embodiment of a die stacked package containing multiple stacked die, as viewed by an observer looking toward a first (e.g., upper) surface of the package, and illustrating a second configuration of a redistribution layer.

FIG. 4 is a perspective view of a third embodiment of a die stacked package 230. Die stacked package 230 has oppositely facing, generally planar upper surface 231 and lower surface 232, and is shown as viewed from upper surface 231 in FIG. 4. BGA interface 233 is visible on upper surface 231. While the traces 204 of the RDL in FIGS. 2 and 3 appears as a relatively uniform pattern of straight conductive areas, an RDL may also appear in less uniform patterns and may even have a serpentine appearance. FIG. 4 illustrates an example of an RDL that is asymmetrical in appearance with respect to the pattern that appears on top surface 231 of package 230, such that some traces 234 are longer than other traces and the pattern of traces may not be the same on all edge surfaces 236 of the package.

Figure 5:
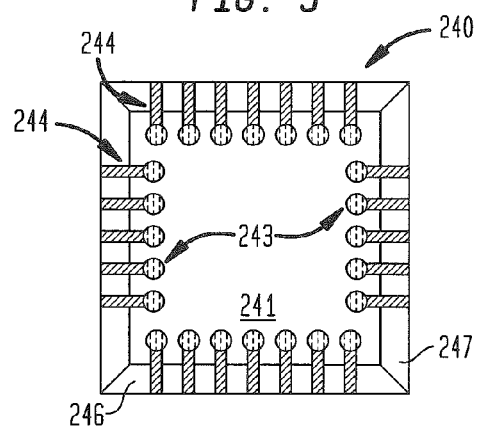
FIG. 5 is a plan view of a fourth embodiment of a die stacked package 240, as viewed from a generally planar upper surface 241, and illustrating a third configuration of a redistribution layer.
Figure 6:
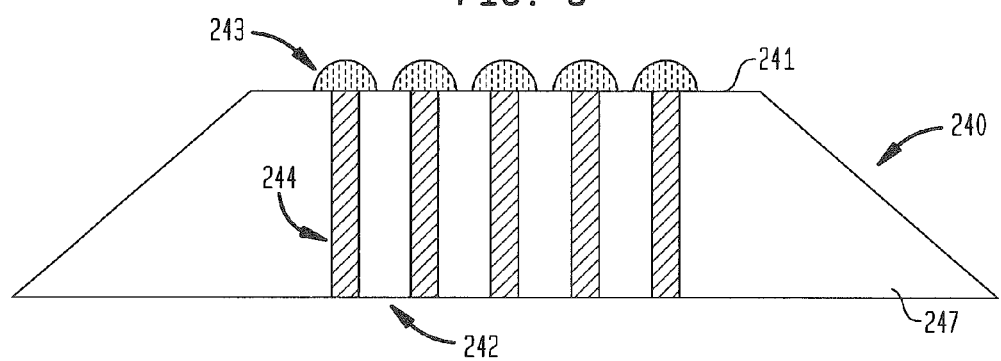
FIG. 6 is a side elevation view of the die stacked packaged of FIG. 5, as viewed by an observer looking directly at an edge surface of the package.

FIG. 5 is a plan view of a fourth embodiment of a die stacked package 240, as viewed from a generally planar upper surface 241. An oppositely facing lower surface of die stacked package 240 is not visible in FIG. 5. RDL 244 in FIG. 5 illustrates an example of a redistribution layer that is symmetrical in appearance with respect to the pattern that appears on top surface 241 and on the edge surfaces 246 and 247 of package 240. FIG. 6 is a plan view looking towards edge surface 247 of die stacked package 240 of FIG. 6. FIG. 6 shows that upper surface 241 is smaller in area than the lower surface 242. As seen in FIGS. 5-6, the upper and lower surfaces 241, 242 are connected by planar edge surface 247 which extends at an inclined angle relative thereto. BGA interface 243 is visible on upper surface 241 of die stacked package 240, and traces 244 of the RDL are visible on the package edge surface 247.

Figure 7A:
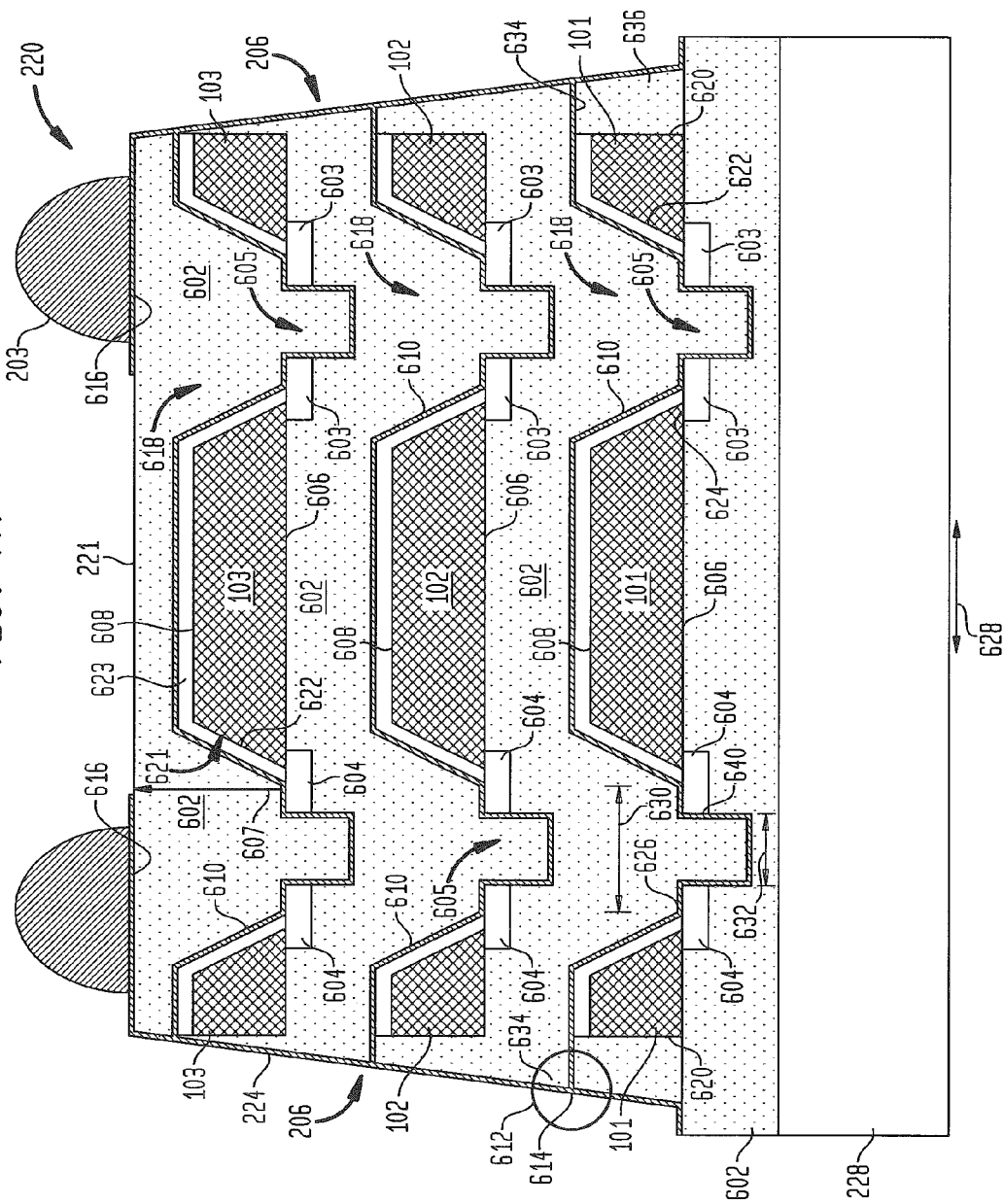
FIG. 7A is a cross-sectional view of the die stacked package of FIG. 3 taken at line A of FIG. 3.

FIG. 7A is a cross-sectional view of die stacked package 220 of FIG. 3 taken at line A of FIG. 3. Note that the cross-sectional view of FIG. 7A is not necessarily drawn to the same scale as shown in FIG. 3; some structures in the cross-sectional view of FIG. 7 may be shown as being larger relative to other structures in the view in order to more clearly show the interior features of die stacked package 220. Lower support structure 228 forms the base of package 220. As can be seen from FIG. 3, the exterior of die stacked package 220 may not reveal the number of die that are stacked within the package.

In the embodiment shown in the cross-sectional elevational view of FIG. 7A, three die 101, 102 and 103 are stacked in a "face down" orientation. That is, the surface of each die on which bond pads 603 and 604 or other metallic pads of the die are disposed is closest to the support plate 228. Note that in the embodiment shown in FIG. 7A, there is a single die on each level of package 220 that appears to be in three distinct fragments or portions, as indicated by the use of identical cross-hatching. This fragmented die structure is explained in more detail below.

A first die 101 is shown attached to lower support plate 228 by a dielectric material 602; first die 101 is surrounded by dielectric material 602 which allows for second die 102 and third die 103 to be similarly stacked and attached in a vertical direction, one above the other. A front face 606 of the second die 102 can be adjacent a rear face 608 of the first die 101, and a front face 606 of the third die 103 can be adjacent a rear face 608 of the second die 102. As seen in the cross-sectional view of FIG. 7A, bond pads or other metallic pads 603 and 604 are exposed at a front surface 606 of each of the first, second and third dies 101, 102, 103. The metallic pads 603, 604 can be electrically connected with microelectronic devices, e.g., semiconductor devices, of each respective die.

Recesses 618 can extend from the rear surfaces 608 of the die 101, 102, 103 toward the front surfaces 606. Examples of the shapes the recesses can have are: cylindrical, frusto-conical, or pyramidal, to name a few. Walls 622 of the recesses can be oriented in a normal direction to the front surface 606, or can be oriented at an angle 621 away from the normal. In one embodiment, walls 622 of the recess 618 can be oriented at an angle 621 of about 5 degrees or greater with respect to a normal to the rear surface. In one embodiment, the walls can be oriented at an angle of less than or equal to about 40 degrees with respect to a normal to the rear surface.

Recesses 618 can be provided such that each recess in a particular die is aligned with a single bond pad of that die. As used herein, unless otherwise provided, a statement that one element is "aligned" with another element underlying such element shall mean that the two elements are "at least approximately aligned" such that there is at least one line which passes through the one element and the underlying element in a direction perpendicular to a surface of the one element. In a particular embodiment, each recess can be formed such that the width of the recess is uniform in lateral directions in the plane of the front surface 606. In one embodiment, the walls 622 of a recess can be vertical, i.e., in a normal direction 607 to the front surface 606 of the die. Alternatively, as shown in FIG. 7A, the recess can be tapered, becoming smaller with increasing distance from the rear surface. Thus, as seen in FIG. 7A, the width of the recess 618 at the rear surface 608 can be quite larger than the width 630 of the recess which is adjacent the bond pad 604.

It can be seen from the figure that a portion of metallic pads 603 and 604 has been removed and conductive vias 605 through the bond pads, i.e., completely through a thickness of the bond pads. As used herein, a statement that a conductive via extends "through a bond pad," or "through a metallic pad" of a microelectronic element shall mean that the metallic material of the via extends completely through a thickness of such bond pad or metallic pad from a rear surface of the pad to a front surface of the pad. Unless otherwise described herein, at least a portion of a bond pad or a metallic pad of a microelectronic element has a thickness extending in a direction away from a surface of such microelectronic element and has lateral dimensions which extend in directions 628 along such surface which typically are substantially larger than the thickness.

Each conductive via 605 typically directly contacts a surface 640 of the bond pad 604 exposed by the hole that extends through the bond pad thickness. Conductive vias are electrically connected with a conductive layer 610, e.g., a layer including or consisting essentially of metal, which extends along a wall 622 of the recess and being insulated from the wall by a dielectric layer 623. Typically, the dielectric layer 623 is relatively thin, and can extend conformally along the walls 622 of the recess and onto the rear surface 608 of each die. The conductive layer can be further connected to a conductive trace 635 which extends along the die rear surface 608 and along a surface 634 of a dielectric layer 636 extending away from edges 620 of the die.

On the exterior surface of die stack package or assembly 220, a plurality of leads, e.g., traces 224 of RDL can extend along the sloping edge surfaces 206 of package 220 and onto upper surface 221 of the package to terminals 616 which are exposed at such surface 221, on which solder spheres or bumps of the BGA interface 203 can be attached. The edge surface 206 can extend along the edges 620 of the die within the package. Interior to die stack package 220 is a conductive layer including conductive traces 610 which provide an electrical pathway between the leads 224 at the exterior of the package 220 and respective bond pads 603 and 604. Trace 610 is represented as a thick black line in the interior of package 220. Several traces 610 may be connected with a single external lead 224, or only one trace 610 may be connected with each external lead 224. Circle 612 in FIG. 7A shows electrical connection 614 which connects wiring trace 610 to redistribution layer 224. Electrical connection 614 may be referred to as an "edge connection" because it is the sectional surface, or edge, of wiring trace 610 that is in contact with redistribution layer 224. Electrical connection 614 may also be referred to as a "T contact" connection because it can be seen that the portion of wiring trace 610 and leads 224 shown in circle 612 together form the shape of the letter T.

Figure 7B:
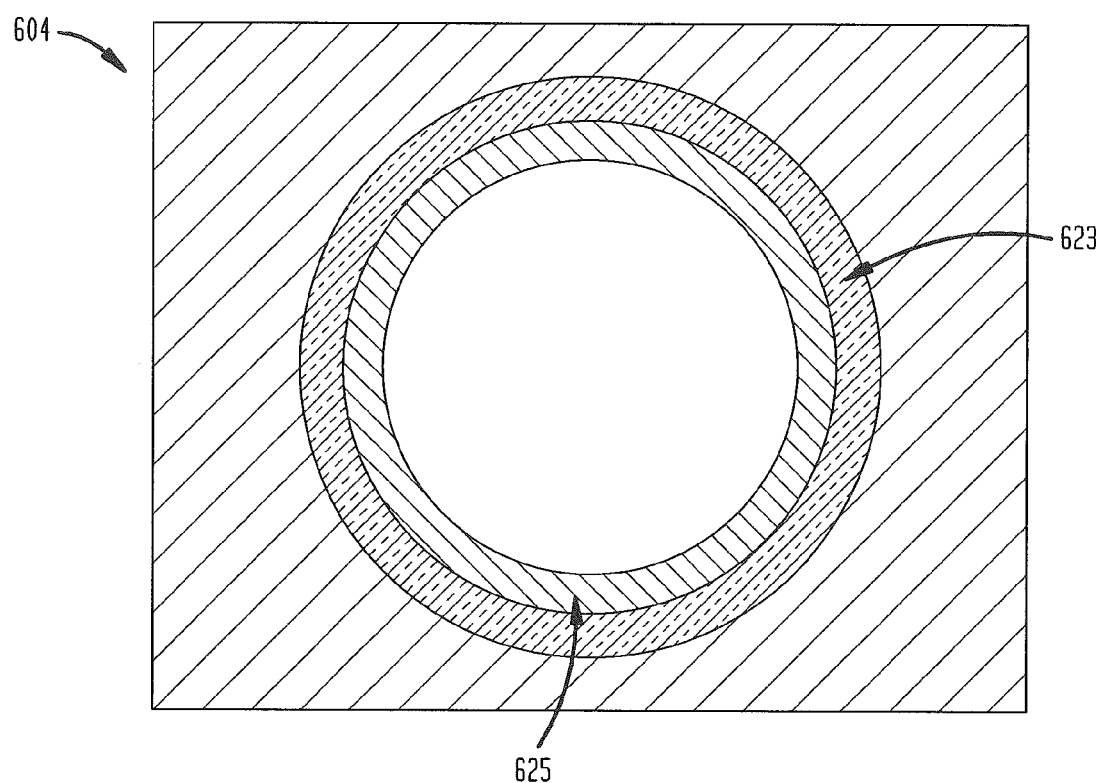
FIG. 7B is a plan view illustrating a conductive via extending through a bond pad in the stacked package of FIG. 3.
Figure 7C:
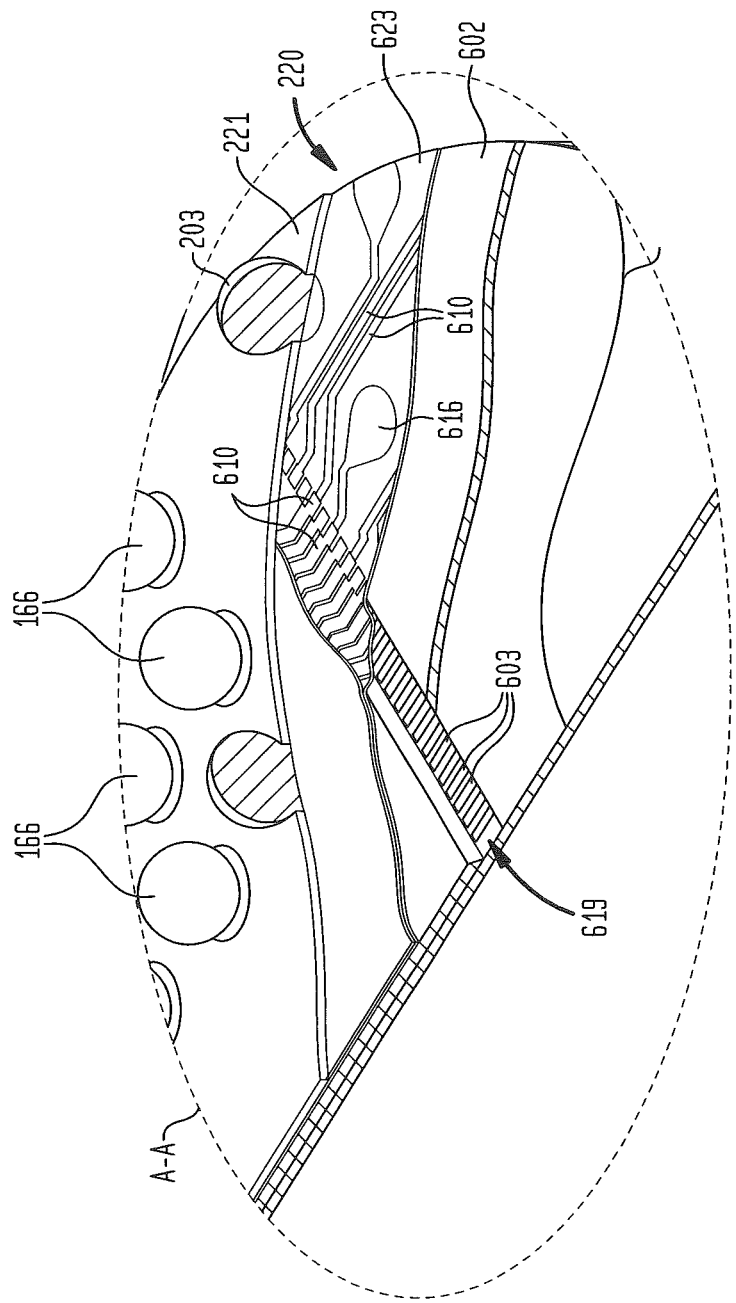
FIG. 7C is a cutaway perspective view illustrating a structure of recesses and connection of bond pads to external terminals in accordance with a particular embodiment.

As further seen in FIG. 7A, an electrical connection is made between the metallic pads 603, 604 at the front surface 606 of each die and the traces 610 of the conductive layer which extend onto rear surfaces 608 of the dies. As described above, and as seen in the cross-sectional view in FIG. 7A, conductive vias 605 can extend through respective metallic pads 603 and 604. This gives the appearance in the cross-sectional view of FIG. 7A that the metallic pads 603, 604 have been separated into two portions and that the section between the two portions appears in the cross-sectional view to have a substantially rectangular shape. As further seen in the corresponding plan view of FIG. 7B, a conductive via 625 can be completely enclosed within the area of a metallic pad 604. FIG. 7B additionally illustrates dielectric layer 623 which is disposed laterally outward from the conductive via.

Each die includes recesses 618 which extend from the rear surface 608 of die towards the front surface 606. The conductive layer, e.g., trace 610, connects to the conductive via and extends along a wall 622 of the recess and along the rear surface 608 of the die towards an edge 620 of the die. The arrangement and fabrication of the recesses 618, conductive vias 605, and conductive layer 610 connected thereto to provide electrical connection between the bond pads at the front surface and the conductive layer at the rear surface of a particular die can be as described below.

During fabrication of die stacked package 220, as discussed in more detail below, the recesses can be formed by various means for removing semiconductor material from the rear surface 608. The recess may expose a portion of a major surface 624 of the metallic pad 603 or 604 which is not ordinarily exposed because it faces inwardly towards an interior of the die. However, in a particular embodiment, the surface 624 of the metallic pad may not become exposed as a result of forming the recess. The recess can have a base 626 which extends in a direction in which the front surface 606 of the die extends. The width 630 of the base 626 in that direction 628 can be greater than the width 632 of the conductive via 605 in the same direction 628.

An opening or "void" can be made, e.g., by drilling, which extends through the full thickness of each bond pad 603 and 604 on a single die and some distance into the dielectric layer 602 adjacent the front surface. A metal layer can then be deposited by a process applied in a direction from the rear surface 608 to form the conductive via 605. In a particular embodiment, trace 610 connected to the via 605 can be formed simultaneously by the same deposition process. In such case, the portion of the metal layer which forms the via 605 in contact with bond pad 603 or 604 and deposited in the void during fabrication may be viewed as contact 605.

In one embodiment, as seen in FIG. 7A, the metal layer can extend from the via 605 conformally along a surface 622 of the recess 618. The dielectric layer 602 may overlie the conductive layer 610 within the recess 618. In addition, dielectric layers can have surfaces 634 which extend beyond the edges 620 of the dies. In such case, the conductive layers 610 can extend in direction 628 along surfaces of the dielectric layers 634 beyond the edges 620 of the dies.

The contact 605 need not have the substantially rectangular shape shown in the cross-sectional view of FIG. 7A, and that the shape of the void produced during fabrication will depend on the technique used to penetrate the bond pads. In some embodiments, contact 605 may be a radially symmetric "T contact" of the type discussed above, and when that embodiment is used, it is referred to herein as a "micro-RT contact" or "μRT contact." A contact 605 can be made at each bond pad in die stacked package 220; as with wiring trace 610, not all instances of contact 605 are called out with a reference number in FIG. 7A.

Figure 7D:
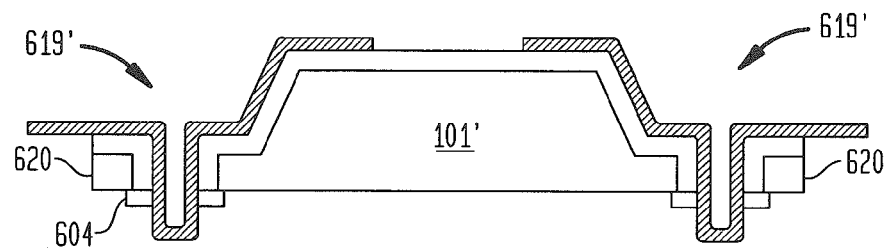
FIG. 7D is a sectional view illustrating a variation of the embodiment of FIGS. 2, 3 and 7A in which the recesses are provided as thinned regions adjacent edges of a semiconductor chip.
Figure 7E:
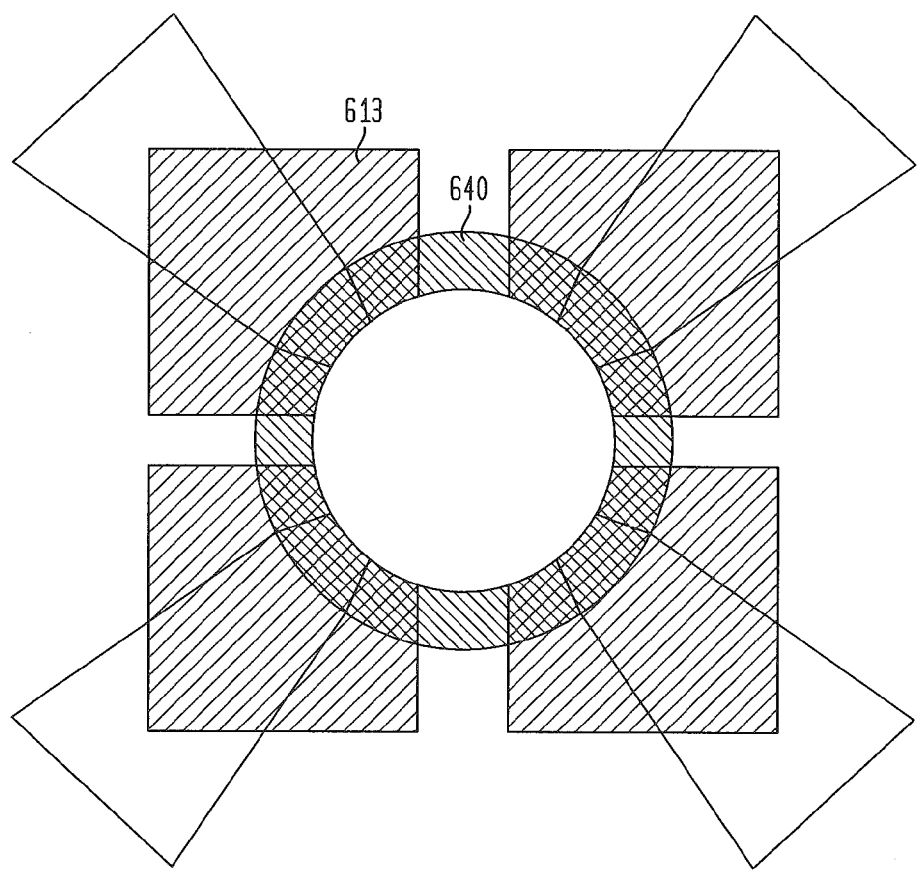
FIG. 7E is a plan view illustrating a conductive via extending through a bond pad in accordance with a particular embodiment of a stacked package of FIG. 3.

In one embodiment, a recess 619 (FIG. 7C) in a die can extend as a trench in a direction into and out of the plane of the drawing which is represented in FIG. 7A. In that case, a plurality of bond pads 603 of the same die can be aligned within the same recess 619 in that die. In a particular embodiment, as seen in FIG. 7D, a recess of a die is formed as a thinned portion 619' of the semiconductor region of the die 101' aligned with the bond pads 604, wherein the thinned portions of the semiconductor region extend to edges 620 of the die.

In a particular variation of the above embodiment, a conductive via 640 (FIG. 7E) extending through at least the partial area of more than one metallic pad 613 on a die can be used to electrically connect the metallic pads with traces extending to other locations on an assembly. In one example, such conductive via 640 could be used to electrically connect the pads 613 together for distribution of power or ground to other locations on the assembly.

Methods of Fabrication of Die Stacked Package Embodiments

As shown schematically in FIG. 8, in one embodiment, fabrication process 800 constructs a die stacked package 820 by making a vertical assembly of two or more die 801 which includes electrically conductive elements, e.g., traces, etc., exposed at an exterior of each die, and providing encapsulation 812 and electrically conductive elements 816 for connecting the die to terminals 814 of the final package.

FIG. 9 is a simplified schematic illustration of Wafer Level Packaging (WLP) process 900. As used herein, Wafer Level Packaging (WLP) is a chipscale packaging (CSP) technology in which steps of packaging microelectronic elements are performed simultaneously as to a plurality of microelectronic elements 801 which, for example, are attached together at dicing lanes 904 in form of a wafer or portion of a wafer. Wafer Level Packaging can also refer to packaging of microelectronic elements performed simultaneously as to a plurality of microelectronic elements 801 which have been previously severed from a wafer but which are attached together at edges 904 of each microelectronic element in form of a reconstituted wafer with a material, e.g., adhesive, holding the microelectronic elements in position.

As further seen in FIG. 9, consecutive individual wafers of die from among two or more wafers 910, 911 and 912 of die 801 are each subjected to fabrication processes that prepare each wafer for alignment and stacking into multi-layer wafer stack 930. For example, each wafer is encapsulated and provided with terminations while still in wafer form. Cutting through multi-layer wafer stack 930 in a direction along the dicing lanes 904 frees individual packages 820, each of which can be fully encapsulated with material 812 and provided with conductive elements 824 and an external electrically conductive interface, such as, for example, ball grid array 803, for attaching package 820 to another component or to a substrate such as a PCB substrate.

In the wafer level packaging embodiment of FIG. 9, the die in each layer are effectively constrained to being all of the same type; their area dimensions and array spacing must substantially exactly match with each the area and dimensions of die on other ones of the wafers that are to be stacked. In addition, the yield of working die on each wafer may vary, and if one die in each of the packages 820 is not working, the overall yield of a fully working die stacked package 820 may be unacceptably low. Compound yield is the final yield when a number of wafers of die are stacked where each layer has a certain yield.

Expressed Mathematically:

Final yield=Yield(layer 1)×Yield(layer 2)×Yield(layer 3) . . . ×Yield(layer N)

For example if the yield in a three layer stack is 60% for the first layer, 90% for the second layer and 98% for the third layer the final yield will be 52%, which may not be economically viable. However if each layer in a three layer stack has 98% yield, the final yield is more acceptable at 94%.

Fabricating Die Stacked Packages Using Reconstituted Wafers

One approach to ensure that the fabrication process produces a high yield of die stacked packages is to build each wafer layer in a stack of wafers from individual die that have passed a degree of testing and are known good die. Known good die may be separated from their original wafer(s), before or after individual testing, and inferior, non-working die may be discarded. Then, the known good die are re-assembled onto a wafer-like substrate in order to take advantage of a wafer level assembly process such as fabrication process 900 of FIG. 9. A wafer-like substrate on which known good die are mounted in an array format is referred to as a reconstituted wafer.

In the case of fabricating a die stacked package such as any one of the packages 200 (FIG. 2), 220 (FIG. 3), 230 (FIG. 4) and 240 (FIGS. 5-6) shown in the figures, the wafer-like substrate that supports the known good die array assembly may also serve as a base layer, such as lower support structure 228 of FIGS. 3 and 7. Typically, the base layer or support plate is shaped to match the external dimensions of a semiconductor wafer so that it can be handled easily by equipment used to perform wafer level packaging steps thereon with die-containing wafers, as described below. In one embodiment, a suitable part to use for the support plate can be a reclaimed silicon wafer having the same diameter (e.g., 200 mm or 300 mm) as the die-containing wafers. Alternatively, in one embodiment, the base layer can consist essentially of a material, e.g., glass, quartz, or other inorganic dielectric material, which has a relatively low coefficient of thermal expansion and relatively high Young's modulus, so that the dimensions of the base layer during processing remain stable with respect to the die-containing wafers, and also provides electrical insulation. Typically, the thickness of the base layer will be about 750 micrometers (also referred to as microns or "μm" herein). As will later be explained, the support plate can either remain a permanent part of the final die stacked package (see e.g., die stacked package 220 of FIGS. 3 and 7) or removed and recycled.

In the embodiments described below, when each layer of die in the die stacked package is built using a number of individual die bonded to the base layer, this can provide advantages over other methods in which the process is performed as to die which remain attached together in form of an uncut wafer. These are, firstly, that the spacing between die can be increased to suit the packaging process. Normally, die are placed as close as possible together on a wafer to maximize occupancy of each wafer. As wafer processing costs are fixed, increasing the number of die on each wafer decreases the unit cost of each. However, if the die are too closely spaced then many of the processes needed to encapsulate the die and provide package terminations might not be applied effectively. By starting with individual die to build the die stacked package the support plate allows the spacing between die to be maximized for die manufacture and also set at a convenient value for the packaging process. For example, in an uncut wafer, the dicing lanes between the die provide a die-to-die spacing of typically 50 μm or less. However, when the die are first severed from the original wafer and then bonded to the support plate, the spacing between adjacent die can range 100-300 μm, for example.

Another advantage of building each layer of the die stacked package using individual die bonded to the support plate is that the individual die that are ultimately packaged into the die stacked package can be obtained from multiple and different sources; that is, the individual die may be obtained from different wafers, from different suppliers and even originate from wafers that have different dimensions. To decrease unit die costs semiconductor manufacturers endeavor to use the largest possible diameter of wafer. However wafer level packaging equipment able to handle the very largest semiconductor wafers may be unavailable or prohibitively expensive. By building each layer in the die stacked package from individual die, the diameter and thickness of the semiconductor wafer from which the original die are sourced are decoupled from the diameter of the support plate used for the wafer level packaging process and the thickness of each layer in the die stacked package. Thus, for example, the support plate can have a smaller diameter than the diameter of the original wafer. Moreover, the support plate might even be rectangular shape, such that, in one embodiment, the die can be arranged in an array having the same number of die in each row.

Figure 10B:
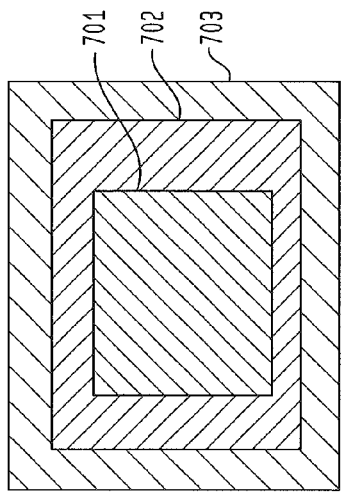
FIGS. 10A, 10B, 10C and 10D illustrate plan and sectional views of a die stacked packages each containing three die having different areas and different locations within the die stacked package with respect to a center line of the package.
Figure 10D:
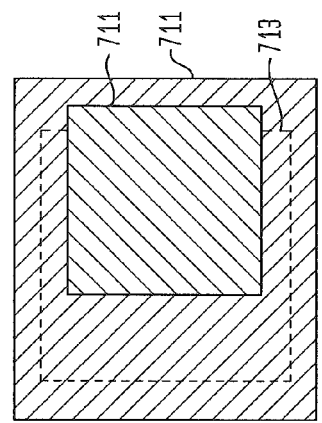
Figure 10A:
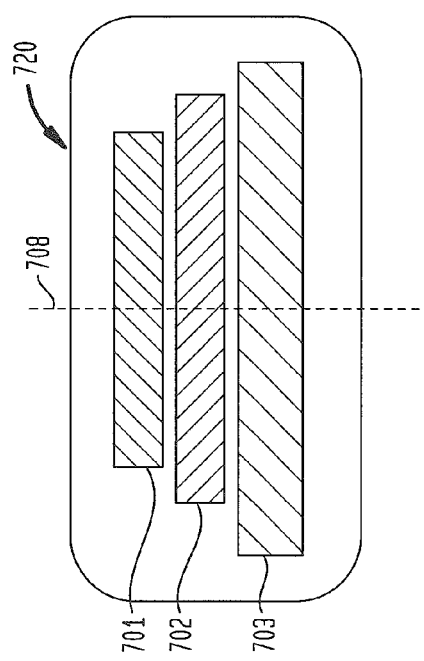
Figure 10C:
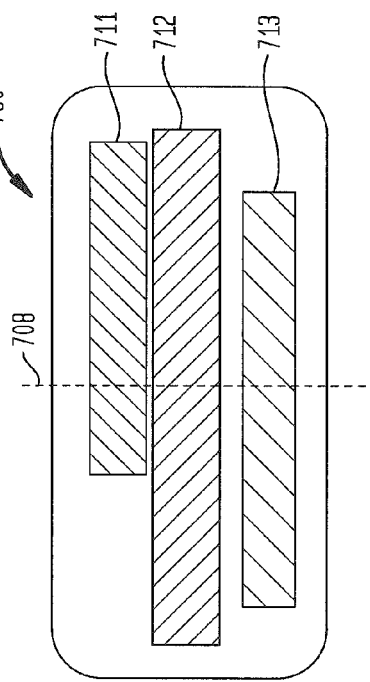

Yet another advantage of building each layer of the die stacked package using individual die is that this fabrication method provides for flexibility in the die dimensions of each layer and the relative locations of the die in each layer. This advantage of flexibility in die size and location is schematically illustrated in FIGS. 10A, 10B, 10C and 10D. Referring back to FIG. 1A, die 101, 102 and 103 are shown as being the same size and centered around center line 108 relative to each other within package 100. FIG. 10A schematically illustrates die stacked package 720 in which the plan area dimensions of die 701, 702 and 703 differ from each other; in FIG. 10A, die 701, 702 and 703 are centered on die pitch center line 708. FIG. 10B is a schematic plan view of the relative size and orientation of die 701, 702 and 703 of FIG. 10A. FIG. 10C schematically illustrates die stacked package 730 in which the plan area dimensions of die 711, 712 and 713 differ from each other; in FIG. 10C, die 711, 712 and 713 are not centered on die pitch center line 708. FIG. 10D is a schematic plan view of the relative size and orientation of die 711, 712 and 713 of FIG. 10C. Because die 712 is larger than die 713, it is wholly obscured in this view and is represented by dotted line shape 712.

Figure 11A:
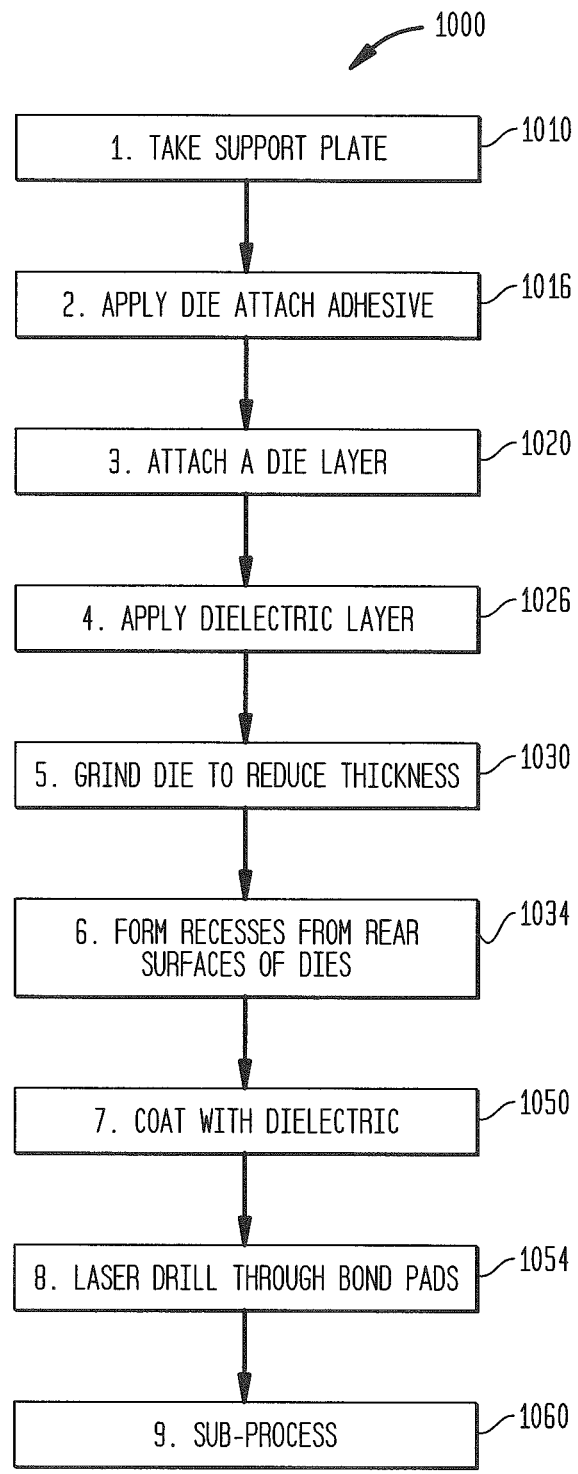
FIGS. 11A and 11B is a flow diagram of the basic fabrication subprocesses used to produce the die stacked packages of FIGS. 2-7.
Figure 11B:
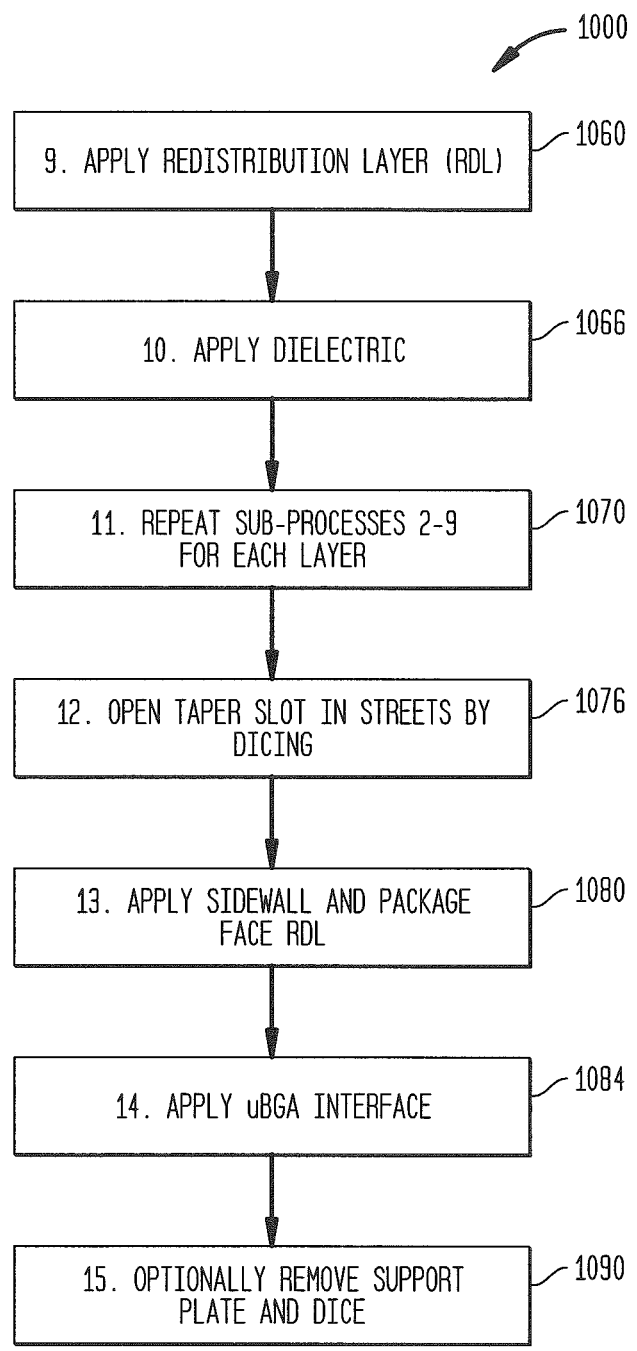

Methods of Fabrication of Die Stacked Package Embodiments Using Reconstituted Wafers FIGS. 11A and 11B is a flow diagram 1000 of the basic fabrication subprocesses used to produce die stacked packages 200, 220, 230 and 240 of FIGS. 2-7. The fabrication processes illustrated in FIGS. 11A and 11B may be carried out as a Wafer Level Packaging (WLP) process. The fabrication processes illustrated in FIGS. 11A AND 11 B are discussed herein in conjunction with FIGS. 12 through 15.

With reference to FIG. 11A and FIG. 12A-D, fabrication process 1000 of a die stacked package begins with sub-processes 1010 through 1030 of building a first reconstituted wafer. In sub-process 1010, a suitable support plate 1210 (FIG. 12A) upon which to build a reconstituted wafer comprising an array of individual die is sourced and prepared. The area of the support plate is populated in sub-process 1020 with a planar array of tested die 1230 (also referred to as a die layer) in a face-down orientation (FIGS. 12B-C), with bond pads 1214 on the front surface of the die facing toward the support plate, using one of any number of techniques to place the die in the appropriate location in the array of die and to join the die with the support plate. Many well-known and understood methods based on commercially available film or liquid adhesives are suitable for this purpose; subprocess 1016 is a representative technique of using a die attach adhesive 1212.

Figure 12A:
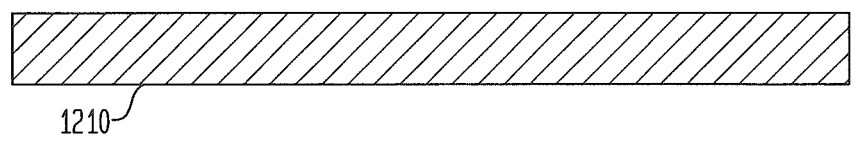
FIGS. 12A-D illustrate stages in processing according to the sub-processes of FIG. 11A.
Figure 12B:
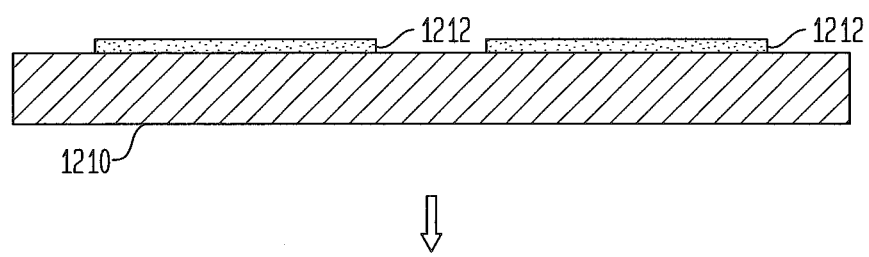
Figure 12C:
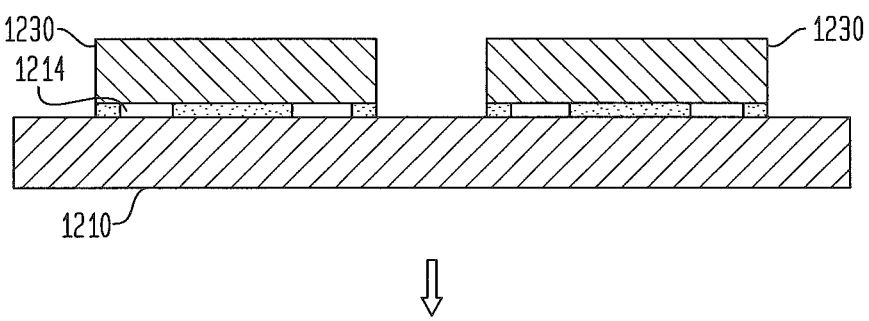
Figure 13A:
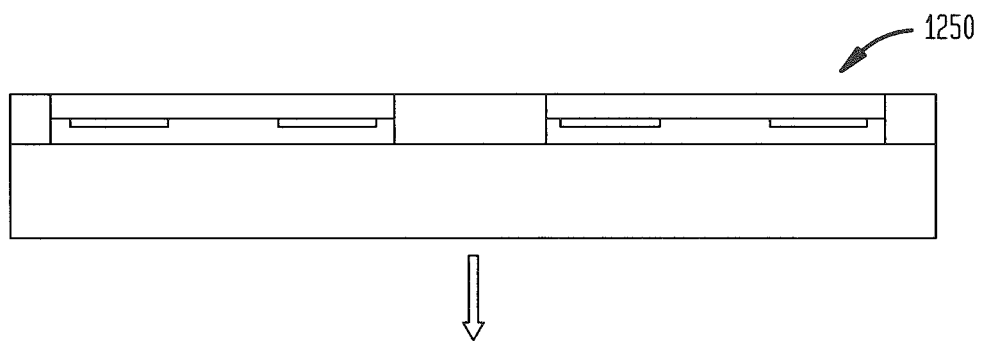
FIGS. 13A-C illustrate stages in processing according to the sub-processes of FIG. 11A.

With reference to FIG. 12C, after attaching the die layer in sub-process 1020, a dielectric layer 1240 is applied over the microelectronic elements 1230 of the die layer in sub-process 1026, filling in the areas between microelectronic elements 1230; dielectric layer 1240 may also cover the rear faces 1232 of microelectronic elements 1230. The dielectric layer can include one or more inorganic dielectric materials such as an oxide, nitride, which may include silicon dioxide, silicon nitride or other dielectric compound of silicon such as SiCOH, among others, or may include an organic dielectric, among which are various polymers such as epoxy, polyimide, among others. As seen in FIG. 13A, the thickness of each microelectronic element can then be reduced in sub-process 1030 by lapping, grinding or polishing the structure from the rear faces 1232 of each microelectronic element 1230. In one embodiment the thickness is reduced to 50 to 100 micrometers. Sub-process 1030 produces thinned reconstituted wafer structure 1250.

Figure 13B:
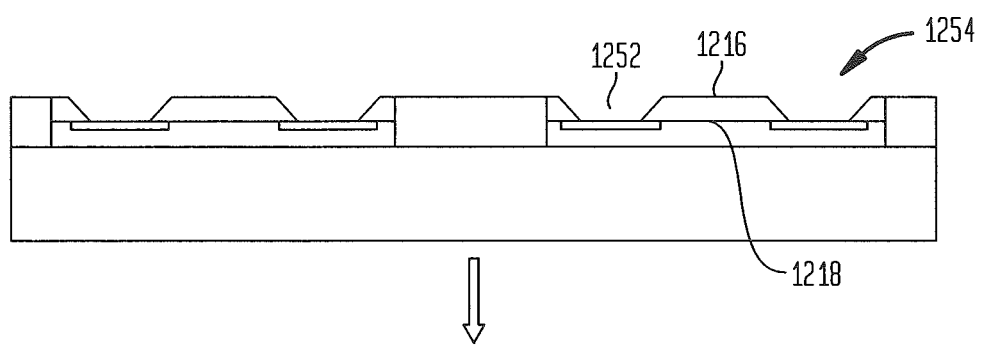
Figure 13C:
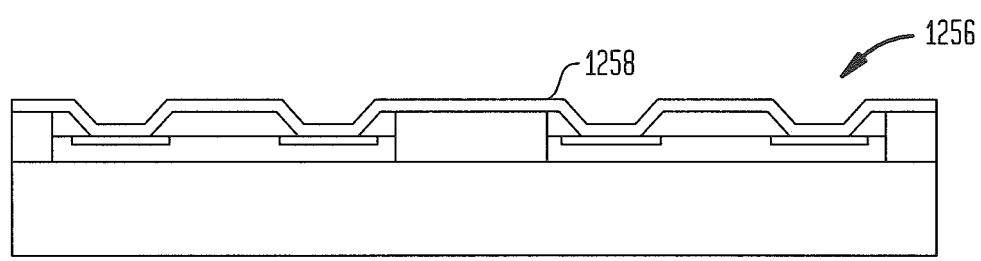

With continued reference now to FIGS. 13B-D, sub-process 1034 forms recesses 1252 (FIG. 13B) extending from the rear surfaces 1216 of the die towards the front surfaces 1218. The recesses 1252 can be tapered such that they have larger width at the rear surface 1216 than locations of the recesses adjacent to the front surface. The recesses may extend entirely through the silicon portion of the die of the thinned reconstituted wafer structure 1250 (FIG. 13A). Vias 1252 are opened at the location of and to the depth of the bond pads on each microelectronic element in structure 1250 using any suitable drilling technique. Sub-process 1034 produces reconstituted wafer structure 1254 (FIG. 13B). In sub-process 1050, a dielectric layer 1258 (FIG. 13C) is applied over reconstituted wafer structure 1254, which can conformally coat the microelectronic elements including interior surfaces of the recesses therein to produce structure 1256.

Figure 14A:
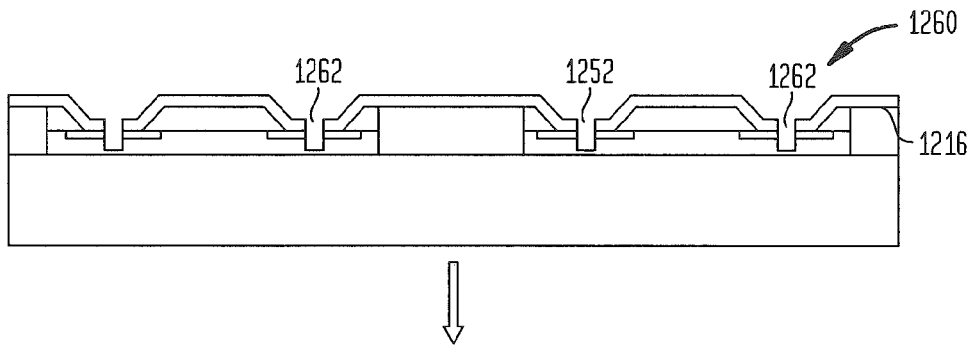
FIGS. 14A-D illustrate stages in processing according to the sub-processes of FIG. 11B.
Figure 14B:
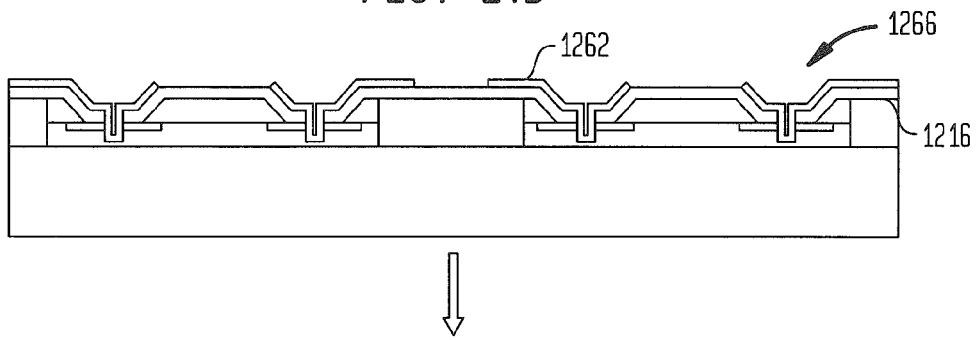
Figure 14C:
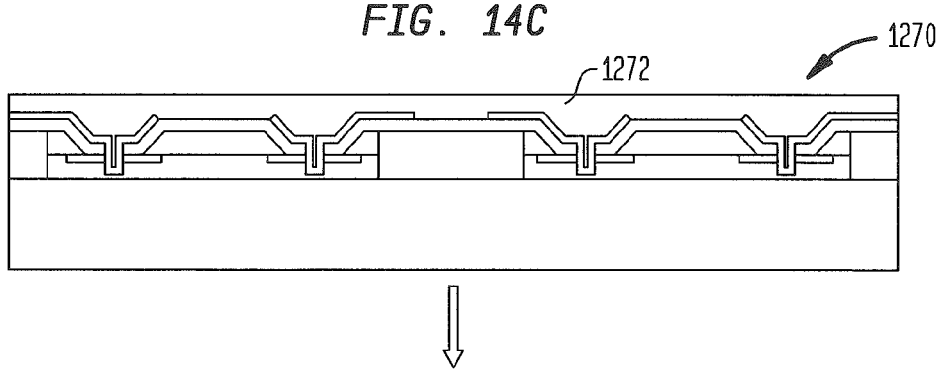

In sub-process 1054, voids 1262, e.g., blind holes are formed by drilling through the bond pads of the individual microelectronic elements of structure 1256. Laser drilling is one suitable technique to use to form voids 1262. Sub-process 1054 produces reconstituted wafer structure 1260. (FIG. 14A)

With reference now to FIG. 11B and FIGS. 14A-D, in the sub-process shown therein, a metal layer 1262 (FIG. 14B) can be formed onto exposed surfaces within the voids 1262, the recesses 1252 and overlying the rear surface 1216 to form the structure 1266 illustrated. By this process, the formed metal layer 1262 can include conductive vias within the voids and traces which extend from each conductive via along a surface of the recess and to locations overlying the rear surface 1216 of each die. The metal layer can be considered a "redistribution layer" as described above and as indicated in subprocess 1060; it provides conductive connection between the bond pads and the traces overlying the rear surface. The metal layer can be formed, for example, by forming a conductive seed layer by sputtering or electroless plating, for example, then photolithographically patterning the seed layer, and then electroplating a metal layer onto the conductive seed layer. The seed layer can serve as an electrical commoning layer during the electroplating step.

Following the formation of the metal layer 1262, a dielectric material 1272 (FIG. 14C) can be deposited to cover the die with the metal layer thereon to form the structure 1270. Then, as indicated at subprocess 1070 (FIG. 11B), another layer of die can be arranged on the dielectric layer 1272 and bonded thereto with a die attach adhesive, and then the sub-processes 1026, 1030, 1034, 1050, 1054, 1060, 1066 (FIGS. 11A-B) can be repeated to form a second substructure 1284 (FIG. 14D) thereon which can be the same as the achieved structure 1270, except that the die of the second substructure are joined with the dielectric layer 1272 of the achieved structure rather than the support plate 1210. In this way, a stacked assembly 1280 containing a plurality of die attached together at edges and vertically stacked with the front faces 1218 of the die of the upper layer 1284 facing the rear faces 1216 of the lower layer of the die. In a particular embodiment, one or more additional layers of die (not shown) having recesses and conductive vias and layers thereon can be formed by the above-described subprocesses.

Subsequently, as seen in FIG. 15A, in a subprocess 1076 (FIGS. 11A-B), a plurality of taper slots, i.e., trenches can be formed which extend in a downward direction away from a top surface 1284 of the dielectric layer 1272 of the stacked assembly 1280 and along edges 1222 of the die. The trenches can also extend in a direction laterally along a surface 1211 of the support plate. In one embodiment, the trenches 1282 can fully separate all the die in one vertical stack 1288A from all the die in another vertical stack 1288B. The trenches can be tapered such that the width 1286 of each trench becomes smaller in a downward direction extending towards the support plate 1210. In one embodiment, the trenches can be formed by a dicing subprocess, such as by using a saw to form a tapered trench between edges 1222 of adjacent die. The traces connected to the bond pads of each die can be exposed at interior surfaces 1224 of the trenches.

Then, as further seen in FIG. 15B, in a further subprocess 1080 (FIGS. 11A-B), conductive leads of an RDL can be formed which are electrically connected with the exposed traces 1262. The leads can be formed, for example, by a process including electroplating, similar to the process by which the conductive vias and conductive traces connected to each die are formed. In one embodiment, a three-dimensional lithography process is used to form the leads 1290, such as described, for example, in U.S. Pat. No. 5,716,759, the disclosure of which is incorporated by reference herein. The leads 1290 can extend onto a face 1292 of each assembly and can be electrically connected with terminals 1294 exposed at the face. Subsequently, in a subprocess 1084 (FIGS. 11A-B), solder bumps or spheres can be bonded to the terminals 1294 to form a BGA interface 1280 (FIG. 15C) for connecting the terminals of the stacked assembly to another element, for example, a circuit panel.

Figure 16:
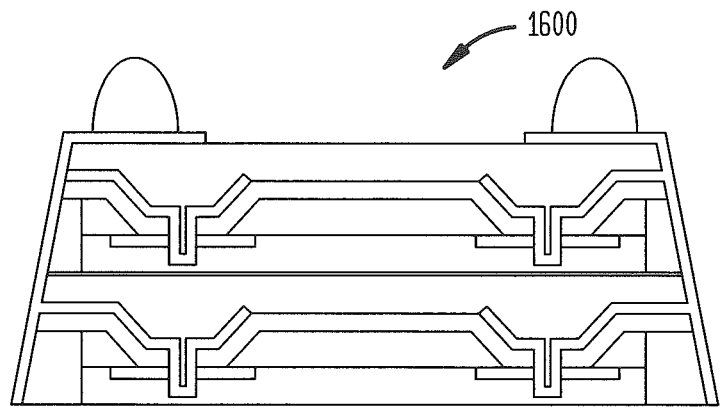
FIG. 16 is a cross-sectional view of a single die stacked package of the type shown in FIG. 2 without a support plate.

Then, in a subsequent subprocess 1090 (FIGS. 11A-B), individual stacked assemblies can be severed from each other, such as by dicing, to form the stacked assembly, e.g., die stacked package 1600 seen in FIG. 16.

In a variation of the above-described embodiment, the subprocesses 1 through 9 (FIGS. 11A-B) can be performed to provide individual subassemblies, each containing a support plate, a layer of die thereon, and conductive vias, and redistribution layer thereon, as described above. The subassemblies can then be stacked and joined together with the support plates between adjacent ones of the subassemblies optionally removed. Thereafter, the subprocesses 12 through 15 (FIGS. 11A-B) can be performed to create a plurality of microelectronic assemblies as shown and described above, e.g., FIG. 7A).

Die Stacked Package Embodiment with Cavity Die

Figure 17:
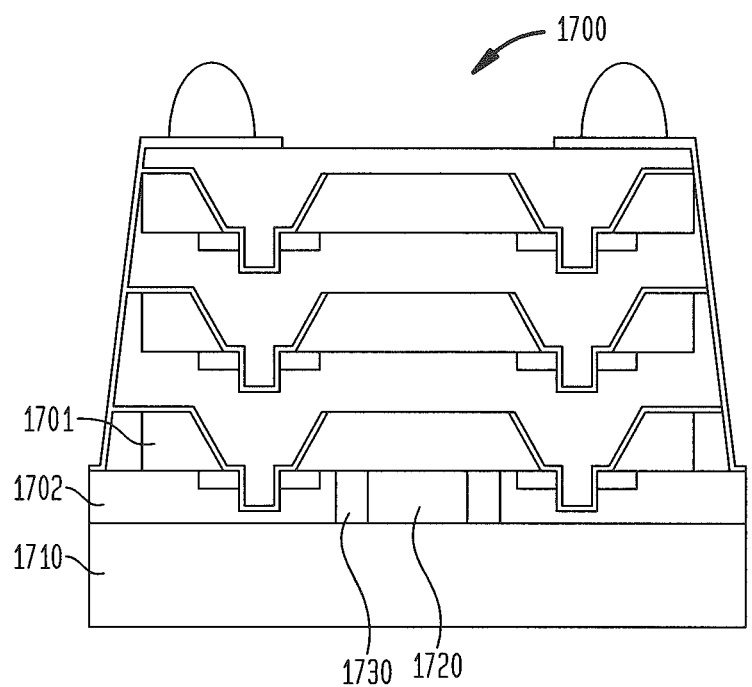
FIG. 17 is a cross-sectional view of a single die stacked package of the type shown in FIG. 3 but including a microelectronic element comprising a cavity over part of the die area as the first layer of the stack.

FIG. 17 is a cross-sectional view of an embodiment of die stacked package 1700 in which the microelectronic element 1701 closest to support plate 1710 in die stacked package 1700 is positioned adjacent a cavity 1720. The cavity may be needed to support the function of a microelectromechanical system ("MEMs") device such as, for example, an accelerometer or a surface acoustic wave ("SAW") filter. Many types of MEMS devices require a sealed gas or vacuum cavity over part of the die area for their function, performance, longevity or assembly. The cavity may be evacuated or filled with gas or liquid in accordance with known practice for such devices. Other types of microelectronic devices, such as, for example, a solid state image sensor can require a cavity to permit focusing of an image onto a surface of the image sensor.

When die 1701 is a solid state image sensor, the support plate is preferably a borosilicate glass which is transparent and has a coefficient of thermal expansion match which is close to that of the die material. The glass wafer will typically range from 100 to 300 micrometers in thickness, but could be as thin as 25 micrometers or could be several millimeters in thickness. Glass can be selected on account of the optic functionality of the image sensor.

Particular techniques associated with fabricating a MEMS device are well known in the art and are omitted from this discussion. With respect to the fabrication process 1000 of FIGS. 11A and 11B described above, process 1000 varies from the above description when microelectronic element 1701 is the first die layer. An array of microelectronic elements 1701 are attached to support plate 1710 by die attach material 1702; die attach material 1702 is prevented from covering the entire front surface area of the die by sidewall material 1730, which leaves cavity 1720 over front surface area of each die.

Die Stacked Packages with Various Die Orientation Embodiments

FIGS. 18A, 18B, 18C and 18D schematically illustrate further embodiments in which the microelectronic elements in a die stack layer may be mounted in different orientations, and in which redistribution layers occur at different positions in the die stack package. In each of FIGS. 18A, 18B, 18C and 18D, the support plate (such as support plate 1210 of FIG. 12) is not shown in the figure but it is assumed to be below the structure illustrated in the figure.

Figure 18A:
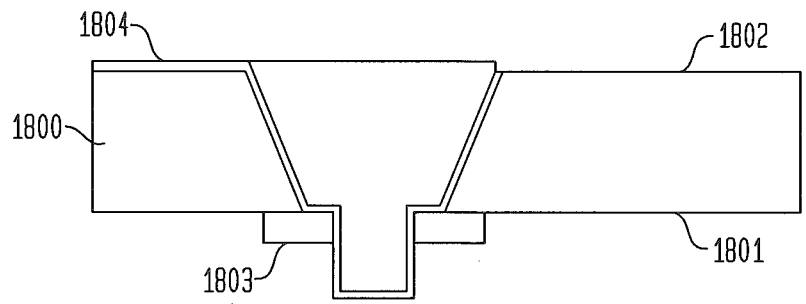
FIGS. 18A, 18B, 18C and 18D schematically illustrate further embodiments in which the microelectronic elements in a die stack layer and redistribution layers may be occur in different orientations with respect to a support plate.
Figure 18B:
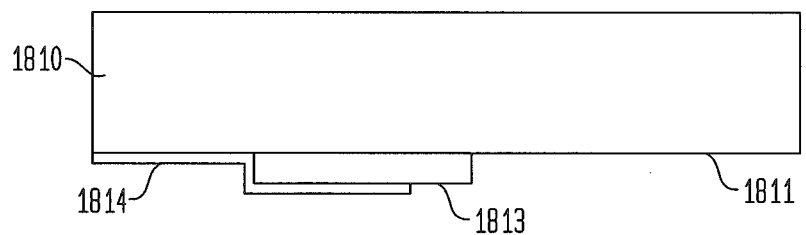
Figure 18C:
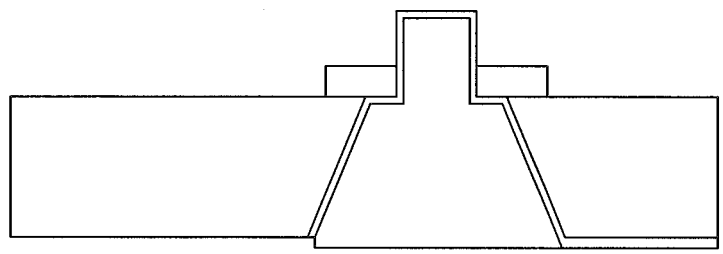
Figure 18D:
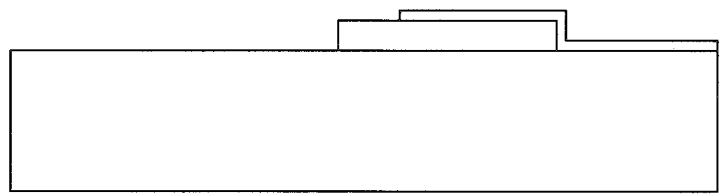

FIG. 18A shows die 1800 in face-down orientation such that bond pad 1803 on the front face 1801 of the die is towards the support plate. RDL 1804 is on the rear face 1802 of the die. FIG. 18B shows die 1810 also in a face down orientation relative to the support plate; RDL layer 1814 is on front face 1811 of die 1810. FIG. 18C shows the die in face up orientation where the RDL is on the bottom face of the die. FIG. 18D shows the die in face up orientation where the RDL is on the front face of the die. Where required, die could simultaneously have both a front face redistribution layer and µRT contacts to the rear face.

Redistribution Layer Embodiments

Hitherto the RDL has been shown in the configuration where one RDL is associated with each layer of die in the stack. It is possible there is a requirement for RDLs in other layers of the stack. These may be independent structures unassociated with a die layer or a die layer may have several RDLs.

In semiconductor device packages containing multiple RDLs it is possible to make connection between them. FIGS. 19A, 19B, 19C and 19D show several further embodiments of the structure where direct contact can be made between wiring traces, lands and bond pads on multiple layers by using a µRT contact.

Figure 19A:
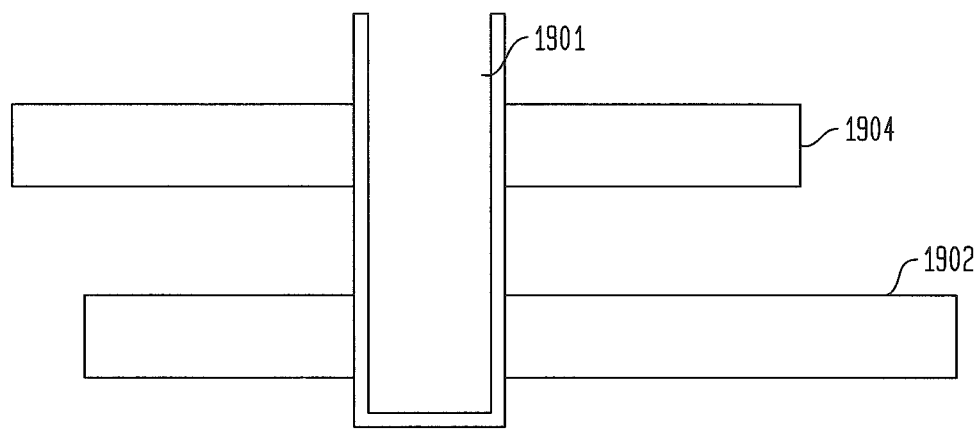
FIGS. 19A-D show four permutations of an extended μRT contact being used to create an electrical pathway between two or more planes possessing electrical conductivity.
Figure 19B:
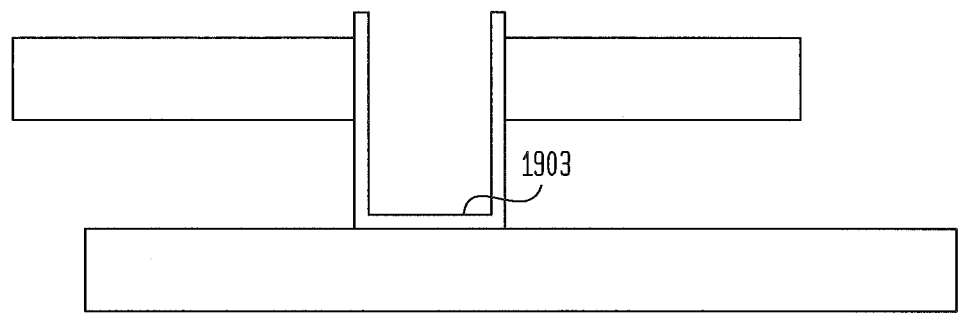
Figure 19C:
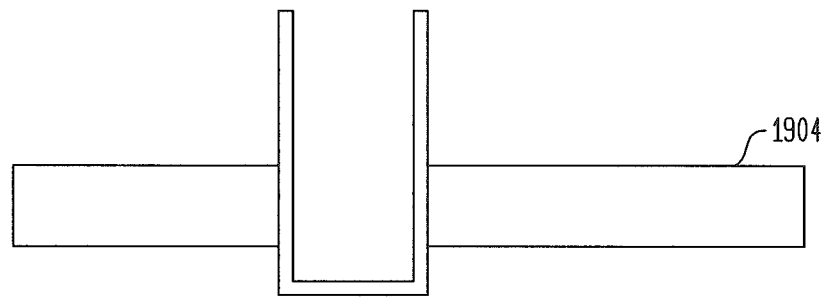
Figure 19D:
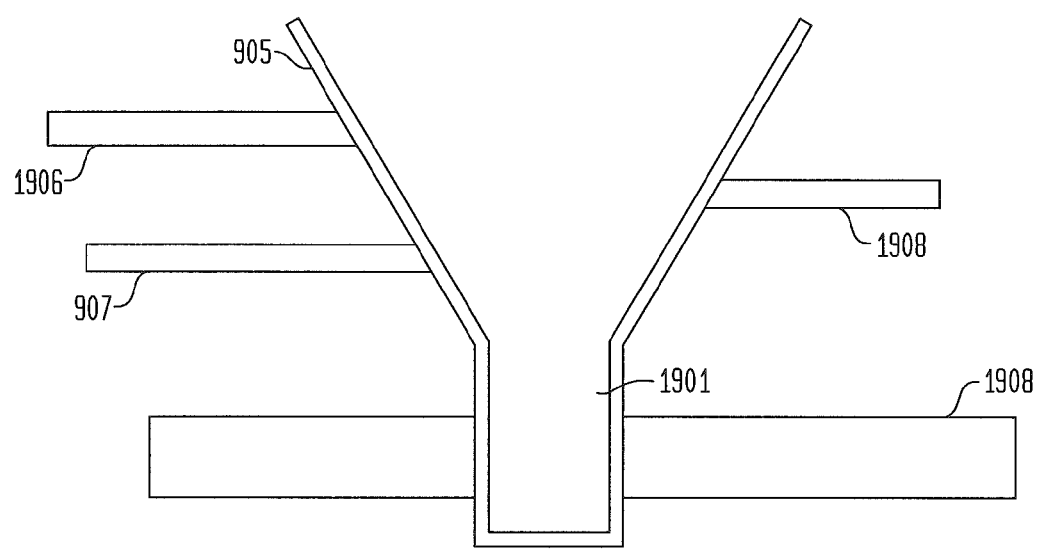

In FIG. 19A, the near-parallel sided portion of the µRT contact 1901 which normally only extends through one RDL 1904 is shown extended to penetrate through a second RDL 1902. In FIG. 19B the near-parallel sided portion of the µRT contact extends through a first RDL but terminates on the surface of a second RDL 1902, joining to it at interface 1903. In FIG. 19C two RDL layers are shown as being joined at interface 1904 with both RDLs being penetrated by the µRT contact. FIG. 19D shows a larger portion of a µRT contact with both the near-parallel sided portion 1901 and its continuation 1905 up an inclined surface. The near-parallel sided portion 1901 connects to RDL 1904 by penetration while the inclined continuations of the µRT contact intersect other RDLs 1906, 1907 and 1908, forming T-style contacts at the intersections.

In FIG. 19A the extended µRT contact connects two layers by penetrating through the thickness of both. In FIG. 19B the extended µRT contact connects two layers by penetrating the upper layer and terminating on the second. In FIG. 19C the extended µRT contact penetrates through the thickness of a Shellcase L-style contact, which is a joint between one layer superimposed on another. FIG. 19D shows several layers connecting to the redistribution layer (RDL) above a µRT contact.

Other Embodiments

Referring now to FIGS. 20A-20H, in a variation of the above-described process (FIGS. 11A-16), the process begins with a plurality of die, e.g., of silicon or other material, which remain attached together at edges 2002 thereof in form of an intact wafer 2000 or portion of a such wafer, wherein dicing lanes 2004 of the wafer extend between the edges 2002 of adjacent die 2001. The wafer then is attached to the support plate or permanent carrier 2010, e.g., by an adhesive, with the bond pads 2003 on the front face 2006 of the wafer adjacent to the support plate. Then, the wafer 2000 is thinned by polishing or grinding or other processing from a rear face 2008 thereof, as shown at 2020.

Thereafter, as shown at 2022, recesses 2024, 2026 are formed which extend from the rear surface 2008 of the wafer towards the front surface 2006. Recesses 2024 are formed in alignment with bond pads 2003 of the wafer. In addition, other recesses 2026 can be formed in alignment with the dicing lanes 2004 of the wafer.

Figure 20A:
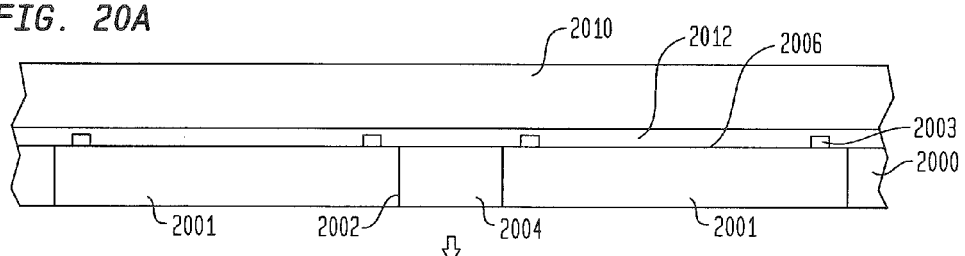
FIGS. 20A through 20H illustrate stages in a wafer-level process of fabricating microelectronic packages having a plurality of die stacked therein.
Figure 20B:
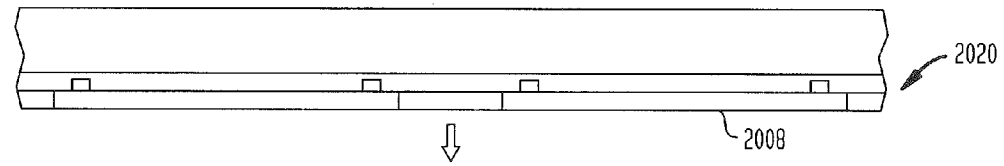
Figure 20C:
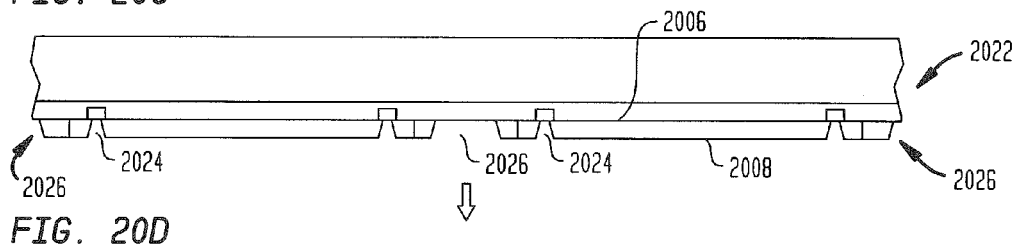
Figure 20D:
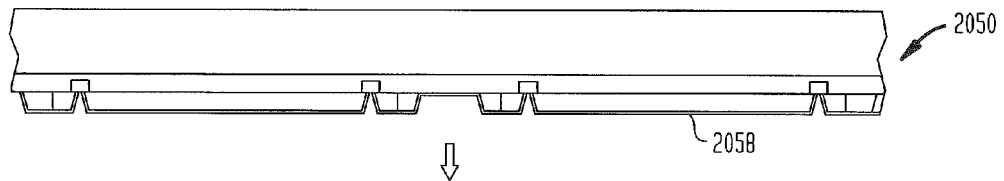
Figure 20E:
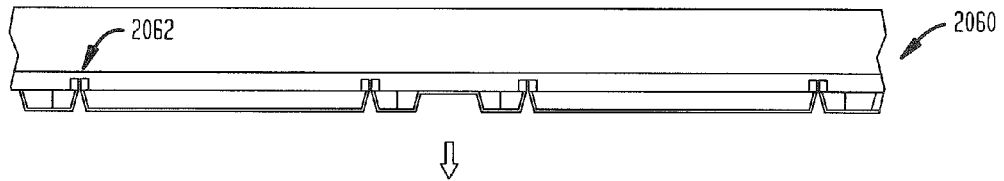
Figure 20F:
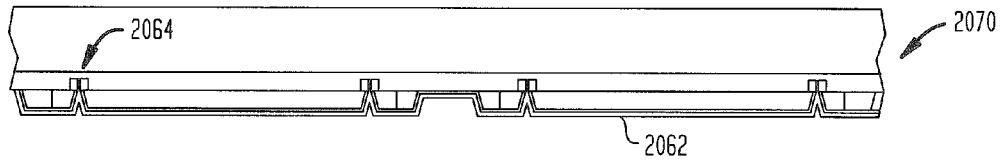
Figure 20G:
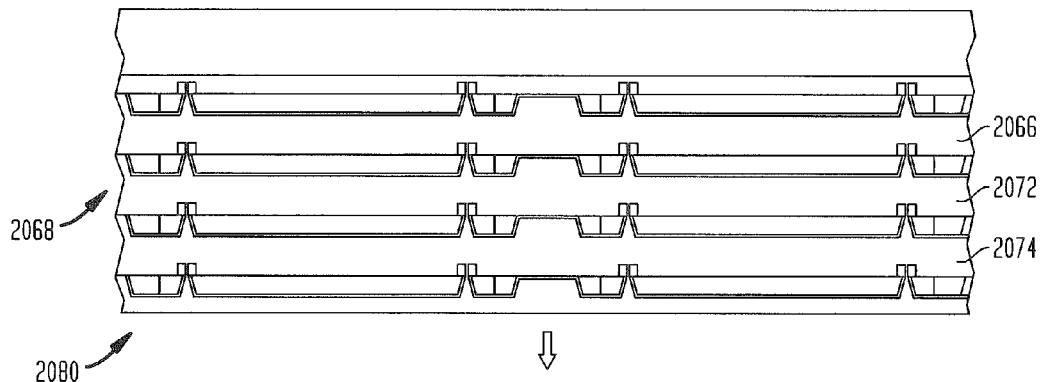
Figure 20H:
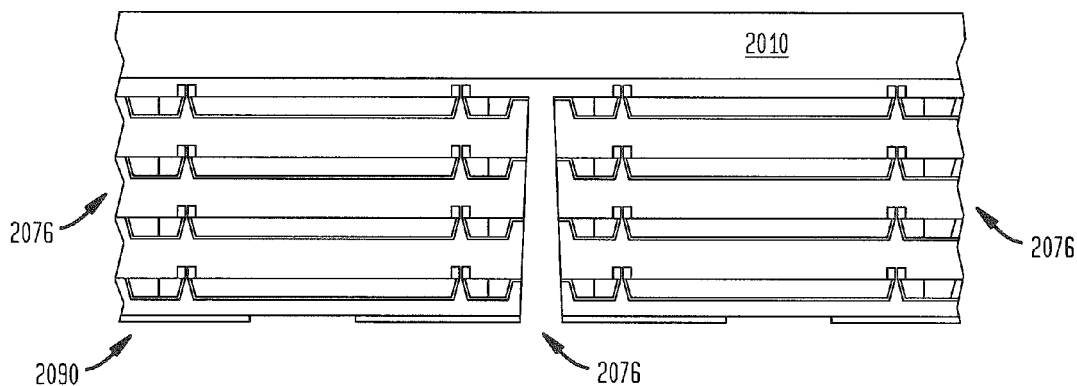
Figure 20I:
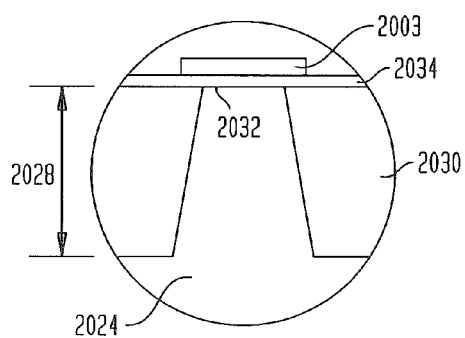
FIG. 20I is a sectional view illustrating formation of a recess in a process of forming a microelectronic package in a particular embodiment.

As seen in FIG. 20C, and as shown particularly in FIG. 20I, the recesses 2024 can extend completely through the thickness of the portion 2030 of the wafer that consists essentially of monocrystalline semiconductor material as a bulk semiconductor region of the wafer. The recesses 2024 may have an interior surface exposing a surface 2032 of a dielectric layer 2034 underlying the bond pad. The recesses 2024 can be formed by etching, drilling (e.g., laser ablation or mechanical drilling) or otherwise removing the semiconductor material of the wafer until the surface of the dielectric layer 2034 is exposed. The etching process can then be stopped. In one embodiment, the removal process can be endpointed when the surface 2032 of the dielectric layer is exposed. In a particular embodiment, the removal process can be performed by an etching process, and the etching process can be performed selectively with respect to the material of the underlying dielectric layer 2034, the bond pad 2003, or both. This process can also apply to any of the foregoing and any of the following described embodiments.

Recesses 2026 typically are formed simultaneously with recesses 2024 and can have a similar structure, except that recesses 2026 are not required to be aligned with bond pads. Recesses 2026 can also extend completely through the thickness 2028 of the monocrystalline semiconductor portion of the wafer. In a particular embodiment, when the wafer has a silicon-on-insulator (SOI) structure, the recesses can extend completely through the bulk semiconductor region, a buried oxide (BOX) layer and the monocrystalline silicon-on-insulator layer that overlies the BOX layer. In one variation, the recesses can extend through the dielectric layer 2034 as well, such that a rear surface 2013 of the bond pad 2003 is exposed within the recess.

With respect to the views 2050, 2060, 2070, 2080, and 2090 in FIGS. 20D, 20E, 20F, 20G and 20H, respectively, the processing described above with respect to FIGS. 11A-16 is applied to structure seen at 2022. Thus, in view FIG. 20D, a conformal dielectric layer 2058 or "passivation layer" can be applied to the exposed surfaces of the recesses, after which, the voids 2062 in the bond pads 2003 can be formed (FIG. 20E), and then a metal layer (FIG. 20F) including the conductive vias extending through the bond pads, and the traces 2062 can be formed. As seen in FIG. 20G, a dielectric layer 2066 then can be formed which covers the rear surfaces of the die 2001 including the metal layer 2062 thereon within the recesses 2024 and the recesses 2026.

The above-described processing (FIGS. 20B-20G) can then be repeated after attaching to the dielectric layer 2066 a second intact wafer or portion of an intact wafer in which the die thereon remain attached together at dicing lanes 2004 of the wafer, as described above relative to FIG. 20A to form a second layer 2068 of die having the structure as illustrated in FIG. 20G. This processing can then be repeated again to form third and fourth layers 2072, 2074 of die, or any number of layers of die in a stacked assembly as seen in FIG. 20G. Referring to FIG. 20H, a dicing operation can be performed to form notches or trenches in the stacked assembly 2090 which extend in a direction from the highest layer 2074 of die downwardly toward the support layer 2010, the notches extending through the recesses 2026 formed earlier in each wafer along the dicing lanes therein. Thereafter, further processing to form leads, a BGA interface, and final dicing into individual assemblies, e.g., die stacked packages can be performed, as described in the foregoing with respect to FIGS. 15B and C. In particular embodiments, the variations described above with respect to FIG. 16 or FIG. 17 or FIGS. 18A through 19D can also be applied here.

Turning now to FIGS. 21A-E, in another embodiment, individual microelectronic elements or die 2101 can be mounted face-down onto a substrate 2110 having wiring patterns 2120 thereon, with an adhesive 2102 bonding the front faces 2108 of the die to a major surface of the substrate 2110. Bond pads 2014 on the front faces of the die can be positioned such that they confront corresponding metallic pads or contacts 2114 of the wiring substrate.

Figure 12D:
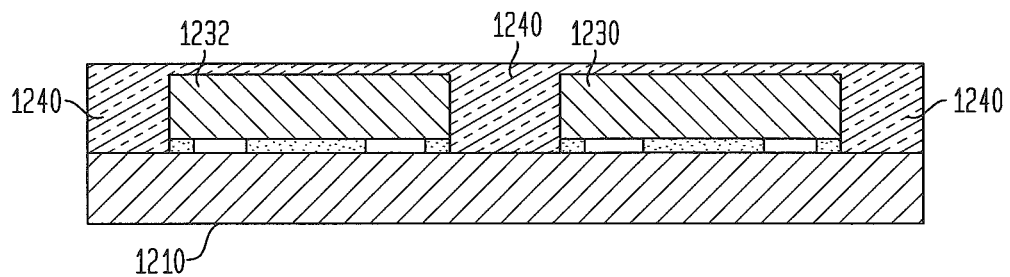
Figure 21A:
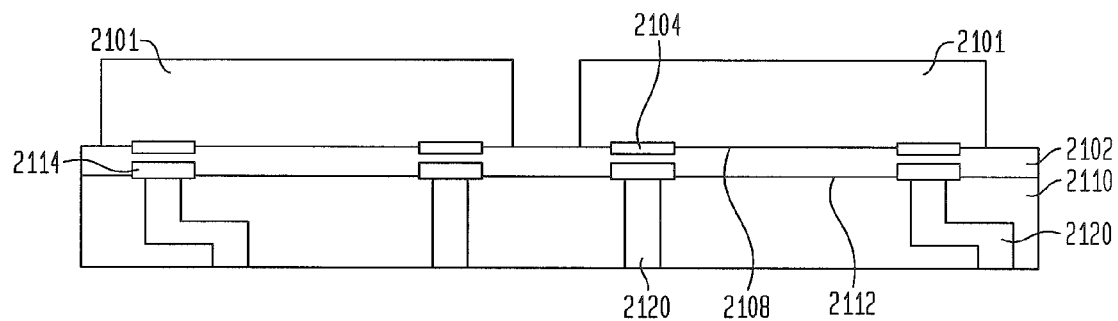
FIGS. 21A-21E are sectional views illustrating a process of fabricating microelectronic packages in accordance with a particular embodiment.
Figure 21B:
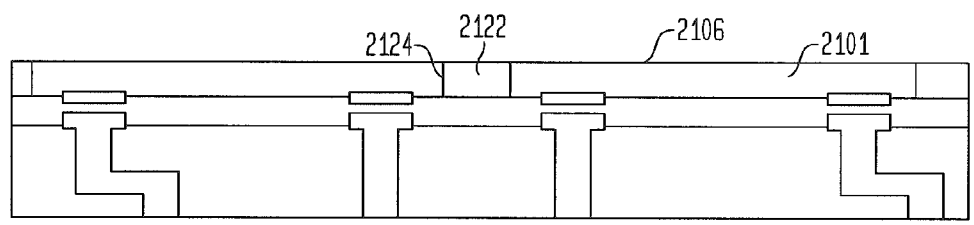

Then, as illustrated in FIG. 21B, a dielectric material 2122, e.g., a polymeric material such as any of the materials used as layer 1240 provided between die in FIG. 12D, can be provided between edges 2124 of adjacent die 2101. The thicknesses of the die can then be reduced, such as by grinding, lapping or polishing the die from the rear surfaces 2106 thereof.

Figure 14D:
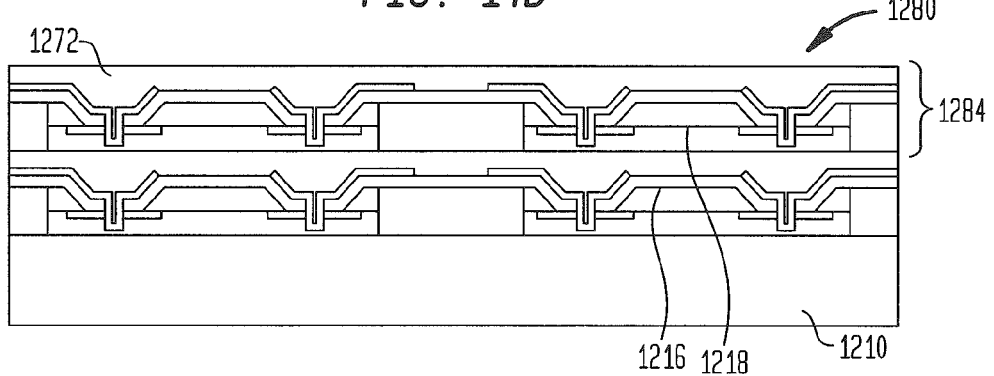
Figure 21C:
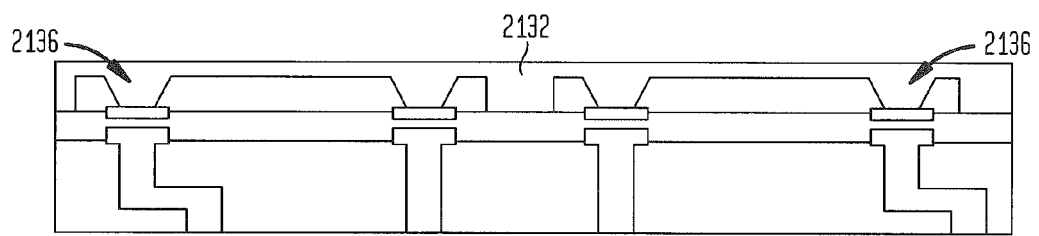

As seen in FIG. 21C, recesses 2136 as described in one or more of the above-described embodiments can be formed in the die in alignment with the bond pads 2104. A further dielectric layer 2132 can then be formed which covers the rear surfaces 2106 of the die and the interior volumes within the recesses. The dielectric layer can be similar to the dielectric layer 1272 (FIG. 14C) which has a relatively flat major surface on which to provide additional structure, such as seen in FIG. 14D. In one embodiment, the dielectric layer 2132 can have a self-planarizing property when deposited. Alternatively, a polishing process can be used to planarize the dielectric layer.

Figure 21D:
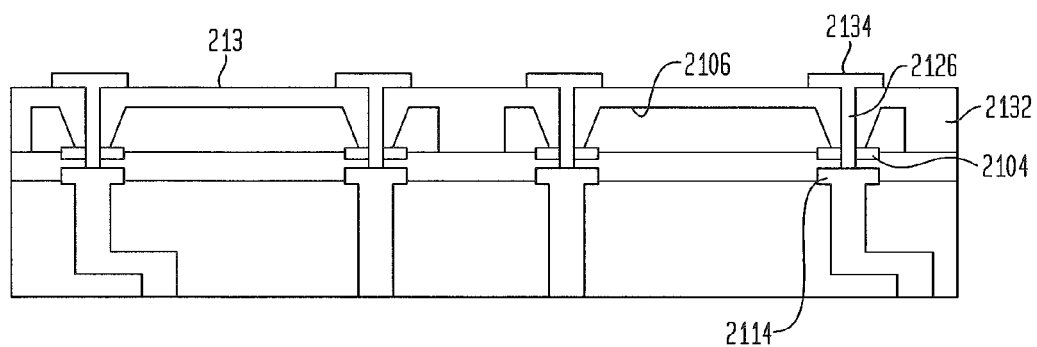
Figure 21E:
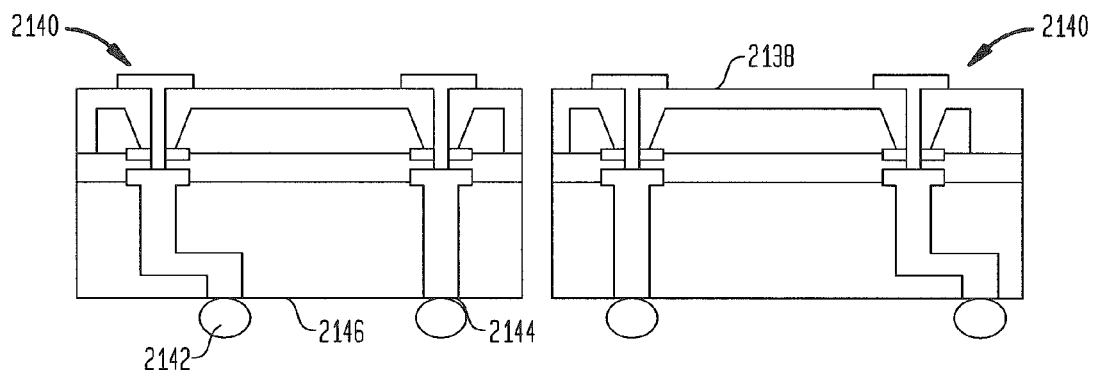

Then, as shown in FIG. 21D, electrically conductive elements, i.e., vias 2126 are formed which electrically connect the bond pads 2104 with the aligned substrate pads 2114. Redistributed conductive elements 2134, e.g. pads or traces, of the structure can extend in a lateral direction along the surface of the dielectric layer 2132 above the rear surfaces 2106 of the die. The redistributed conductive pads 2134 can function as terminals available to connect other elements, e.g., another microelectronic assembly, circuit panel, or other active or passive electrical or electronic device thereto. As seen in FIG. 21E, in one embodiment, the assembly can be severed, e.g., by a dicing operation, by sawing or otherwise severing the assembly along edges of the die into individual packaged microelectronic elements 2140. Solder bumps or balls 2142 can be attached to conductive elements such as terminals 2144 of the wiring substrate which are exposed at surface 2146 remote from the microelectronic element.

In one embodiment, the conductive elements 2126 and the pads 2134 can be formed as follows. Holes can be drilled through the thickness of the dielectric material 2132, the holes extending through the bond pads 2104 and at least exposing the substrate pads 2114 adjacent each bond pad. The holes may extend into the thickness of the substrate pads 2114. Then, a metal layer can be electroplated in the holes and onto the major surface 2138 of the dielectric layer. In one embodiment, the locations at which the pads or traces 2134 are formed can be controlled by forming a patterned electrically conductive seed layer on the surface 2138 prior to electroplating a metal thereon to a desired thickness.

Figure 22A:
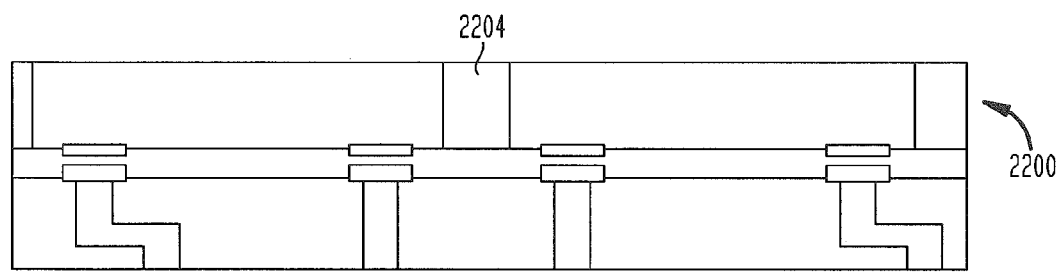
FIGS. 22A-22C are sectional views illustrating a variation of the process shown in FIGS. 21A-E.
Figure 22B:
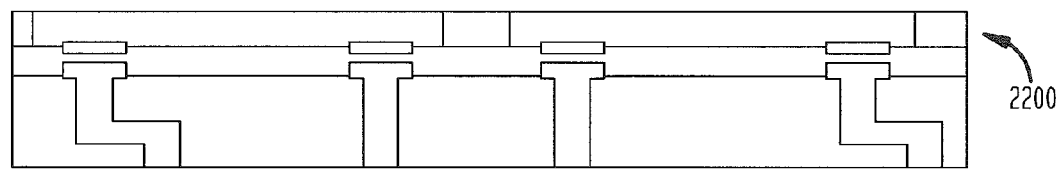
Figure 22C:
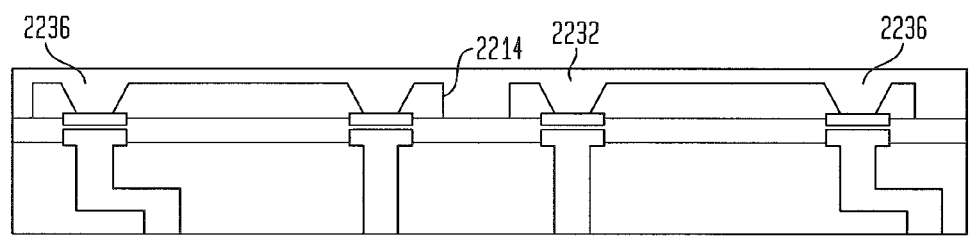

FIGS. 22A, 22B and 22C illustrate a variation of the above-described embodiment (FIGS. 21A-E), in which an intact wafer 2200 or portion of an intact wafer containing a plurality of microelectronic elements as yet uncut from each other is bonded to the substrate, wherein the monocrystalline semiconductor material of the wafer remains between edges of the die as dicing lanes 2204. Then, the wafer 2200 is thinned from the rear surface, as seen in FIG. 22B. FIG. 22C shows a further stage of processing in which the semiconductor material between edges 2214 of adjacent die is removed and the recesses 2236 are formed in the die. The dielectric layer 2232 can then be formed to cover the rear surfaces of the die, the recesses 2232 and the spaces which were formed between the adjacent die.

Referring now to FIG. 23A, in a variation of the above-described process (FIGS. 21A-E), conductive traces 2334 can be formed which extend along the major surface 2338 of the dielectric layer 2332 away from a conductive via 2326 at one die, beyond the edge of such die, and towards a conductive via 2326 at another die. As seen in FIG. 23A, traces 2334 can extend continuously between the conductive vias 2326 of two adjacent die and can electrically connect the two die as initially deposited.

FIG. 23B illustrates a further embodiment in which the steps required to form the layer of die 2301 having recesses and conductive vias therein, as well as the traces 2336 electrically connecting the conductive vias (see FIGS. 21A-D and the accompanying description above), are repeated to form additional layers 2310, 2320, 2330 of die and traces 2330 extending beyond the edges of each respective die. In one embodiment, as seen in FIG. 23B, the traces can have ends between the adjacent die, as seen in FIG. 23B. Alternatively, the traces 2330 can extend continuously between the conductive vias of adjacent die, as seen in FIG. 23A.

Figure 23C:
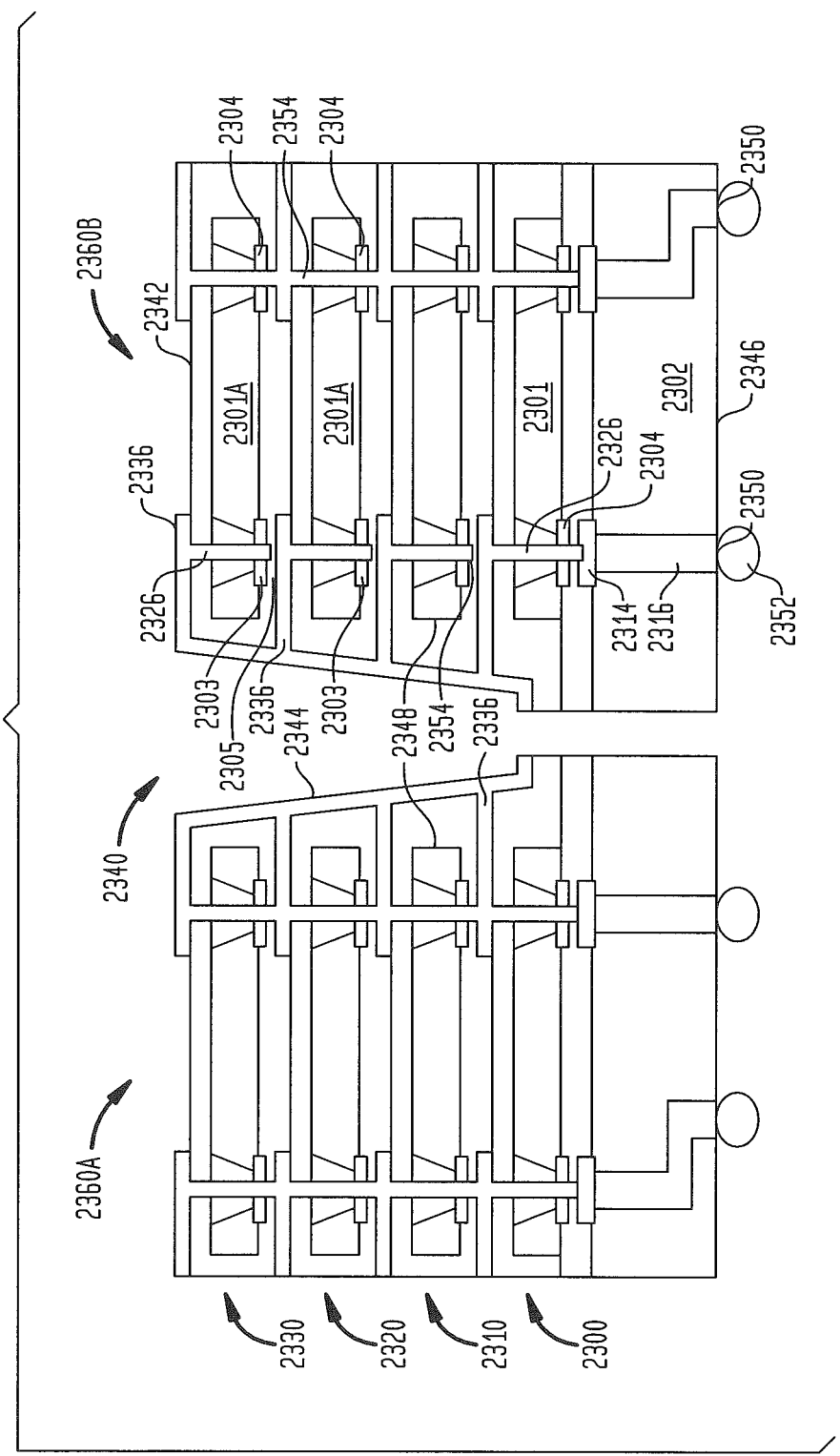

As further illustrated in FIG. 23C, a notch 2340 can be formed which extends downwardly through the traces 2336 connected to each die, after which leads 2344 can be formed which extend along the surfaces of the notch 2340 onto a major surface 2342 of the assembly. The notch can be formed, for example, by sawing between the edges 2348 of adjacent die in a direction extending along the edges 2348 of the die. In one embodiment, the leads 2344 can connect the traces connected to each of the vertically aligned bond pads of the assembly so as to provide busses 2354 between at least a pair of adjacent die 2301A therein. The vertical busses 2354 can connect two or more die which are vertically adjacent each other, i.e., in which faces of at least adjacent ones of the die overlie each other. For example, it can be seen that busses 2354 at the right hand side of assembly 2360B in FIG. 23C electrically connect the bond pads at faces of the die 2301, while the conductive vias 2326 at the left hand side of assembly 2360B in FIG. 23C do not electrically connect the bond pads 2303, there being electrically insulating dielectric material 2305 between the bond pad 2303 of the uppermost die labeled 2301A and the trace 2336 disposed between the uppermost die and the die labeled 2301A which is adjacent to the uppermost die.

The busses 2354, in turn, can be connected to external terminals 2350 through the electrical connection provided by the conductive vias 2326 which are electrically connected to the bond pads 2304, the aligned substrate pads 2314, and the wiring elements 2316 of the substrate 2302 connected thereto. The wiring elements, in turn, can be connected to terminals 2350 exposed at the face 2346 of the substrate remote from the die 2301 therein. The assembly can be severed into individual stacked assemblies 2360 by cutting the assembly along the notch through the leads 2344 and the substrate 2302 thereunder. Solder bumps or balls 2352 can be metallurgically bonded to the terminals to facilitate joining of the stacked assembly 2360 to corresponding contacts of other circuit components, for example, a circuit panel.

Figure 24A:
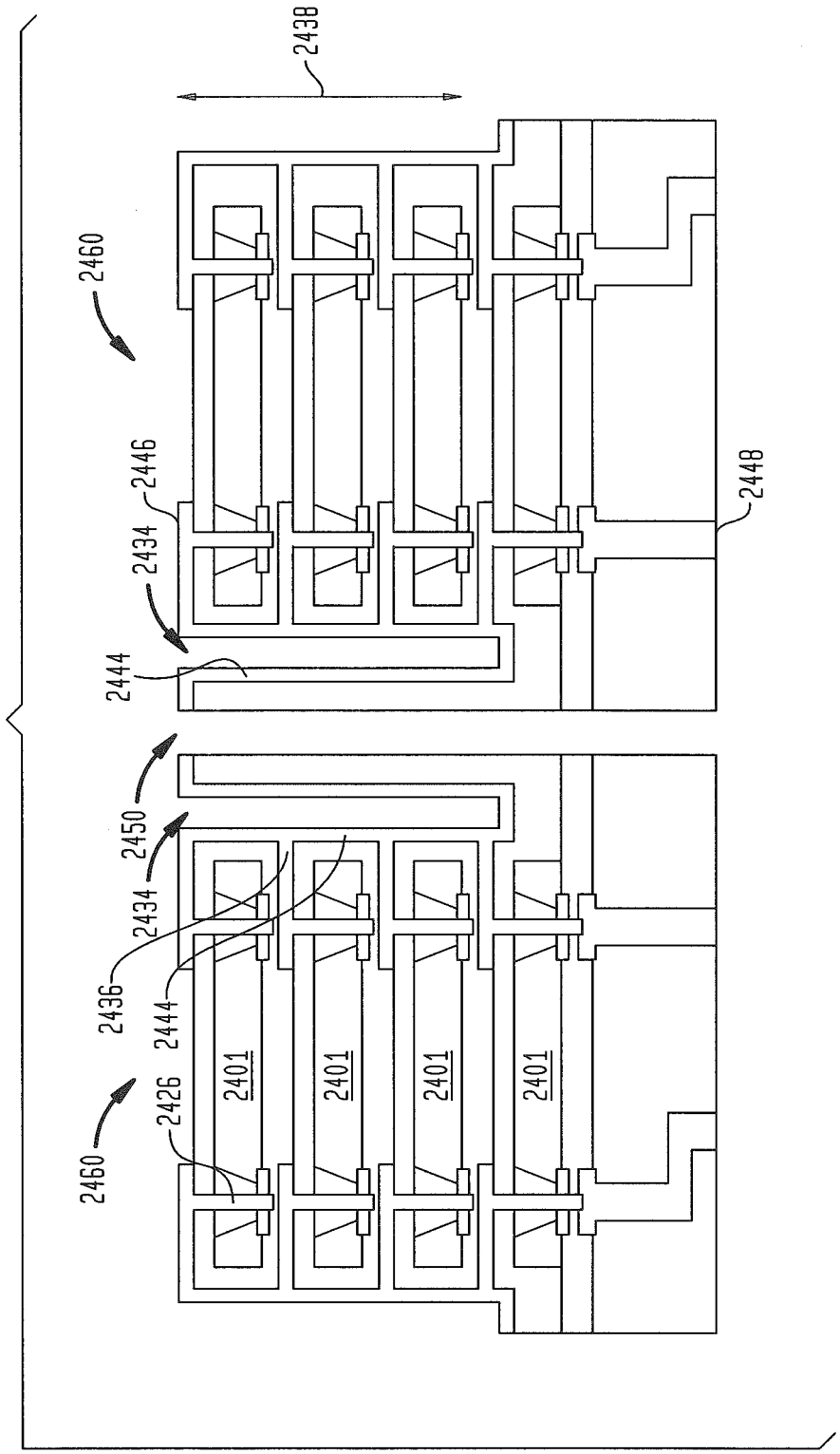
FIG. 24A is a sectional view illustrating a variation of the process shown in FIGS. 23A-C.
Figure 24B:
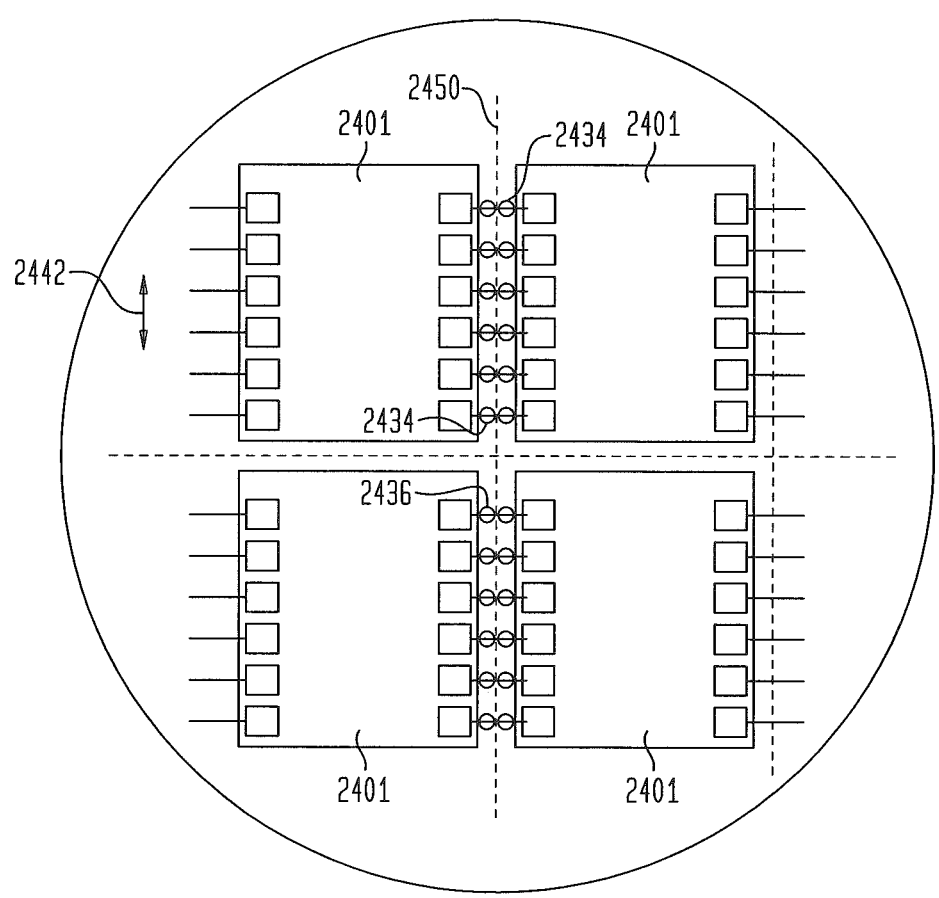
FIG. 24B is a plan view corresponding to the sectional view of FIG. 24A.

FIGS. 24A-B illustrate a stacked assembly 2460 in accordance with a variation of the embodiment shown in FIG. 23C. In this embodiment, instead of forming notches which will become the edge surfaces 206 (FIGS. 2-3) of each microelectronic assembly, individual openings 2434 can be formed in the assembly, such as by laser drilling or mechanical drilling, for example, which expose the traces 2436 extending away from the die therein. The openings can be cylindrical, so as to expose only a single trace that leads away from a particular die. Then, a metal or metallic material can be deposited into the openings to form electrical conductors 2444 connected to the traces 2436 of the die within the assembly, the conductors being electrically connected with terminals 2446 at an upper surface of the assembly, terminals 2448 at a lower surface of the assembly, or terminals at both surfaces. FIG. 24A also depicts the severing of the assembly along a line 2450 between the edges of adjacent die into individual assemblies 2460 or die stacked packages.

If the traces 2436 leading away from each of the die 2401 within the stacked arrangement are in vertical alignment (with respect to a vertical direction 2438 in which the die are stacked), then one of the openings can expose each of those vertically aligned traces of the stacked die. Then, the electrical conductors 2444 can be connected to each such die. Alternatively, the traces of each die can be offset from one another in a direction 2442 such that a single opening exposes no more than one trace of the die which are vertically stacked atop one another, such that each electrical conductor connects to a single trace of a single die. In this way, each conductor can be electrically connected to one, more than one, or all of the traces 2436 to which the bond pads 2401 are electrically connected by way of the conductive vias 2426. In addition, if desired, bond pads of two or more adjacent ones of the die can be selectively electrically connected by way of the conductive vias 2426 using electrically conductive busses, as described above with respect to FIG. 23C.

Figure 25A:
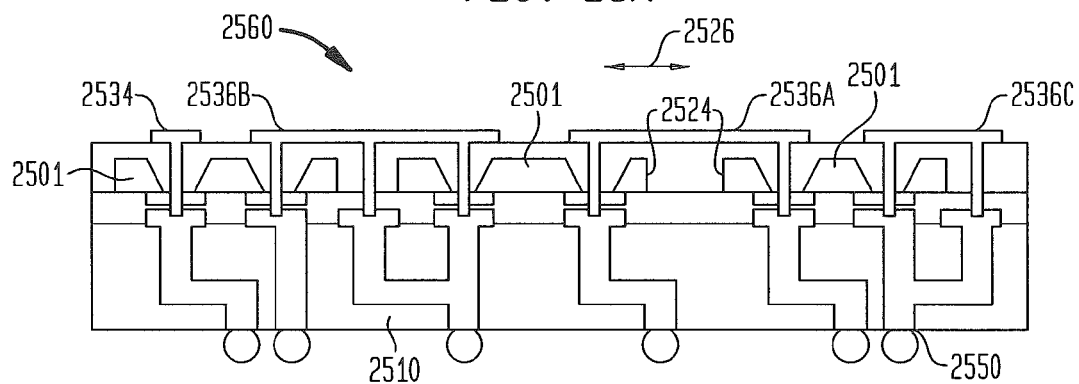
FIGS. 25A-C are a sectional view and corresponding plan views of a multiple die package and a wafer containing sets of die for making multiple die packages, in accordance with a particular embodiment.
Figure 25B:
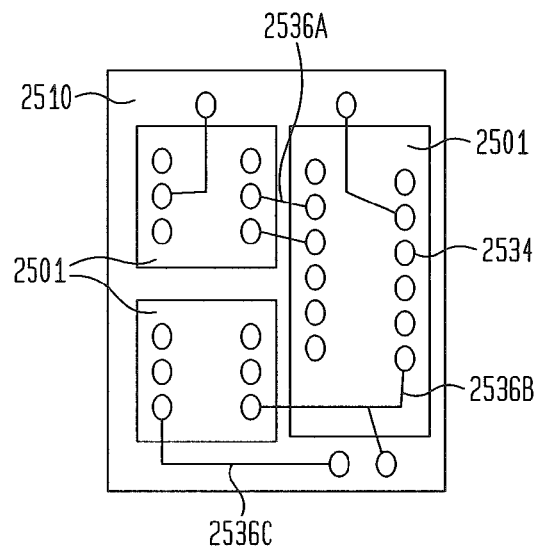
Figure 25C:
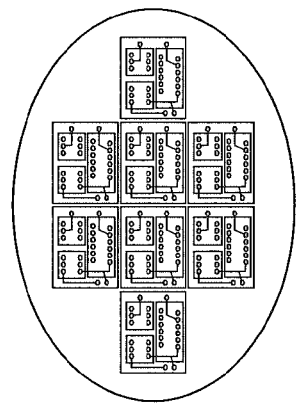

FIGS. 25A-C illustrate a microelectronic assembly in accordance with a variation of the above-described embodiments (FIGS. 21A-23C). In this embodiment, a plurality of die 2501 can be positioned laterally adjacent one another, the edges 2524 of adjacent die being separated in a lateral direction 2526 by a dielectric material which can be a polymeric material such as epoxy. A multiple die module 2560 includes the die and a supporting substrate 2510 having wiring elements therein and terminals 2550 exposed at a face thereof. Conductive traces of adjacent die can electrically connect particular pairs of contacts of the adjacent die in the completed multiple die package, or can be connected to other contacts of the substrate, or both. For example, as seen in FIGS. 25A-B, trace 2536A electrically connects pads of two different die 2501; trace 2536B electrically connects pads of two different die 2501 with a contact of the substrate; and trace 2536C electrically connects a pad of a different die 2501 with a contact of the substrate. As further seen in FIG. 25C, die which are to be connected in this manner to form multiple die modules can be arranged together in form of a reconstituted wafer containing a plurality of sets, each set containing the die which are to be packaged together in multiple die module as seen in FIGS. 25A-B.

Figure 26A:
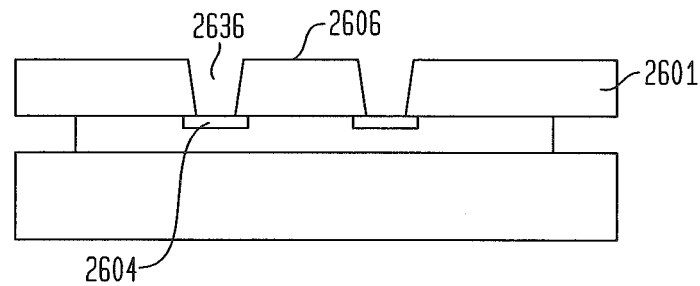
FIGS. 26A-H are sectional views illustrating stages in fabrication of a microelectronic package in accordance with a particular embodiment.
Figure 26B:
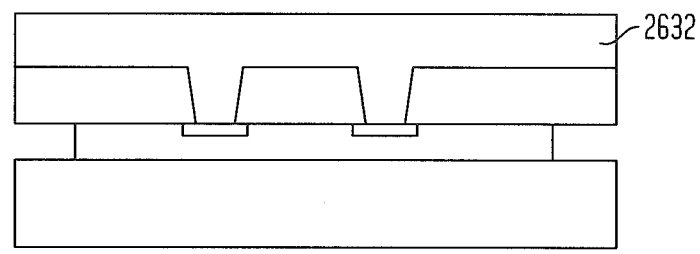
Figure 26C:
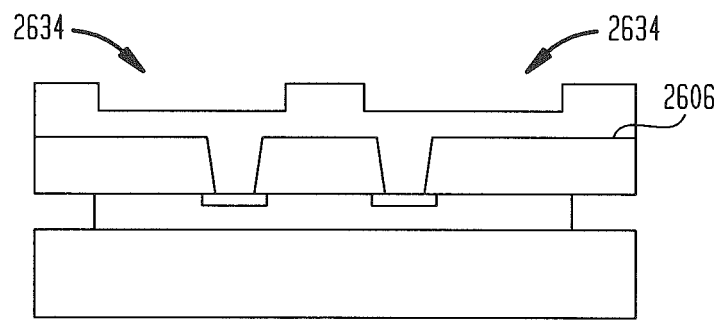
Figure 26D:
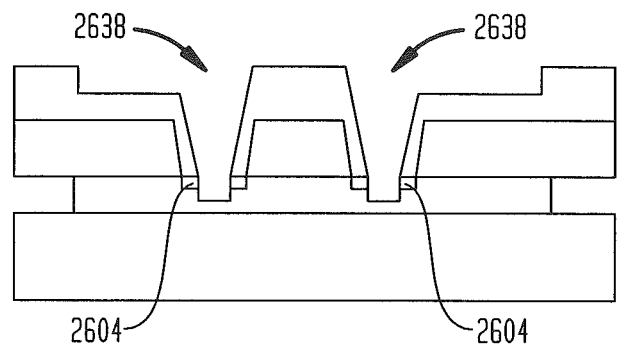

In another embodiment, as seen in FIGS. 26A-H, the metal traces which line the recesses and extend along the rear surface of the die can be formed by a damascene method. FIG. 26A illustrates the formation of recesses 2636 in the rear surface 2606 in alignment with the bond pads 2604 of a microelectronic element 2601, e.g., a die, wafer, reconstituted wafer or portion or of a wafer or reconstituted wafer. Then, as seen in FIG. 26B, a dielectric material is deposited to fill the recesses and cover the rear surface of the microelectronic element as a dielectric layer 2632 thereon. The dielectric layer 2632 can be self-planarizing such as described above. Then, as illustrated in FIG. 26C, trenches 2634 are etched in the dielectric layer in alignment with the recesses. The trenches can have dimensions, e.g., width and length, extending along the rear surface 2606, which are the same as the conductive elements to be formed therein. Then, as seen in FIG. 26D, openings 2638 are formed in alignment with the bond pads, the openings extending through the bond pads 2604.

Figure 26E:
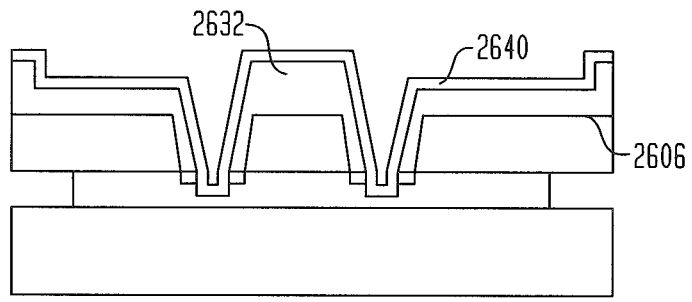
Figure 26F:
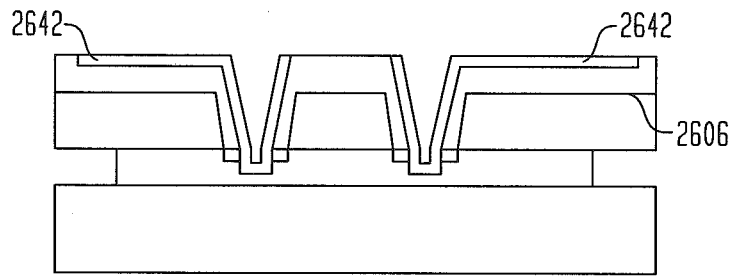
Figure 26G:
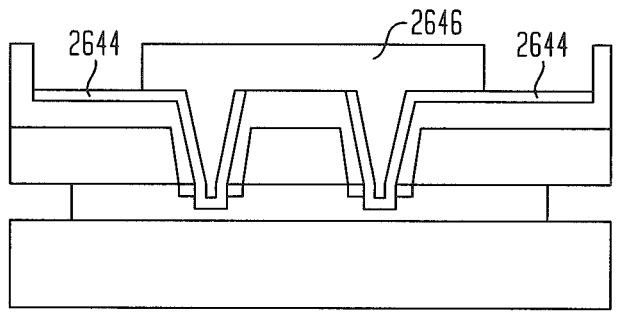
Figure 26H:
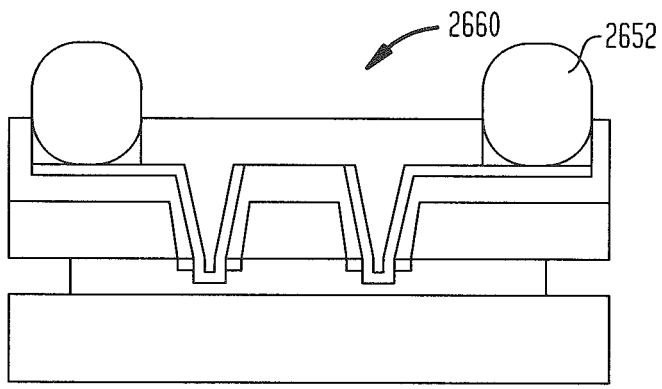

FIG. 26E illustrates the formation of a conductive layer 2640 which extends through the bond pads, along walls of the recesses, and above the dielectric layer 2632 along the rear surface 2606. FIG. 26F illustrates a stage of grinding or polishing the structure, with a result of planarizing the structure and separating the conductive layer 2640 into individual conductive elements 2642. Each conductive element 2642 can include a conductive via extending through a bond pad, and a conductive trace extending therefrom along a wall of a recess 2636 and onto the dielectric layer 2632 disposed at the rear surface 2606. In this way, each conductive element 2642 can be electrically insulated from each other conductive element 2642. Then, as illustrated in FIG. 26G, additional dielectric material 2646 is deposited to cover the conductive elements 2642, with openings formed above portions of the conductive elements as terminals 2644. In one embodiment, the dielectric material can be a blanket-deposited layer of epoxy, after which the terminals can be exposed by laser ablation of the overlying epoxy material. In another embodiment, a photo-imageable solder mask material can be deposited onto the rear surface of the microelectronic element and then patterned by photolithography to expose the terminals 2644. FIG. 26H illustrates a subsequent stage of processing in which solder bumps or balls 2652 are attached to the terminals 2644 to permit joining the terminals of the package 2660 to corresponding pads or other contacts of another circuit component such as, for example, a circuit panel.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A stacked microelectronic assembly, comprising:
   first and second microelectronic elements each having a front face, a bond pad on the front face, a rear face remote from the front face, and edges extending between the front and rear faces, the microelectronic elements being stacked such that the front face of the first microelectronic element is adjacent one of the front or rear faces of the second microelectronic element, the microelectronic assembly having a face overlying one of the front or rear faces of each of the first and second microelectronic elements,
   wherein each of the first and second microelectronic elements includes a conductive layer extending along at least one of the front or the rear face of such microelectronic element, and at least one of the first and second microelectronic elements includes: a) a recess extending from the rear face towards the front face, and b) a conductive via extending from the recess of the least one microelectronic element through the bond pad of the at least one microelectronic element and electrically connected to such bond pad, wherein the conductive layer of the at least one microelectronic element extends along the rear face of the least one microelectronic element and is electrically connected to the via;
   a plurality of leads extending from the conductive layers of the first and second microelectronic elements; and
   a plurality of terminals of the assembly electrically connected with the leads,
   wherein the microelectronic assembly has at least one external edge surface extending away from the face, each external edge surface extending along the edges of the first and second microelectronic elements, the leads extending along the at least one external edge surface and onto the face of the assembly.

2. The microelectronic assembly as claimed in claim 1, wherein the leads extend onto the face of the assembly and the terminals are exposed at the face of the assembly.

3. The microelectronic assembly as claimed in claim 1, wherein the microelectronic assembly has at least one opening extending through at least one of the first and second microelectronic elements, and the leads extend along a surface of the at least one opening.

4. The microelectronic assembly as claimed in claim 1, wherein each of the first and second microelectronic elements includes the recess and the conductive via, and the conductive layer of each microelectronic element is electrically connected to the via of such microelectronic element.

5. The microelectronic assembly as claimed in claim 1, wherein the first microelectronic element includes the recess and the conductive via, the conductive layer of the first microelectronic element being electrically connected to the via of the first microelectronic element, and the conductive layer of the second microelectronic element electrically contacts a surface of the bond pad thereof, the surface extending along the front face of the second microelectronic element.

6. The microelectronic assembly as claimed in claim 1, wherein the conductive layer of the at least one microelectronic element extends conformally along a surface of the recess, and the assembly further includes a dielectric layer overlying the conductive layer within the recess.

7. The microelectronic assembly as claimed in claim 6, wherein the conductive via includes a conductive layer lining a hole extending through the bond pad, wherein the dielectric layer overlies the conductive layer within the hole.

8. The microelectronic assembly as claimed in claim 1, further comprising dielectric layers having surfaces extending beyond the edges of the microelectronic elements, wherein the conductive layers extend in a first direction along the surfaces of the dielectric layers beyond the edges.

9. The microelectronic assembly as claimed in claim 8, wherein at least one of the leads includes a portion extending in a first direction along the portion of at least one of the conductive layers, the lead portion electrically contacting the conductive layer portion.

10. The microelectronic assembly as claimed in claim 1, wherein the at least one lead is a first lead, wherein at least one second lead includes a conductive via extending through the lead portion and the conductive layer portion.

11. The microelectronic assembly as claimed in claim 1, wherein the recess is a first recess, and the edge of the at least one microelectronic element including a second recess, wherein the conductive layer extends along a surface of the second recess.

12. The microelectronic assembly as claimed in claim 11, wherein the conductive layers further extend onto major surfaces of dielectric layers beyond the second recesses.

13. The microelectronic assembly as claimed in claim 1, wherein the first microelectronic element further includes an image sensor, and the assembly further includes a transparent lid overlying the image sensor.

14. The microelectronic assembly as claimed in claim 13 wherein a cavity is disposed between the lid and a face of the microelectronic element, the image sensor being aligned with the cavity.

15. The microelectronic assembly as claimed in claim 1, further including a lid mounted above the front face of the first microelectronic element, wherein a cavity is disposed between the front face and the lid, the first microelectronic element including a micro-electromechanical system ("MEMS") device aligned with the cavity.

16. The microelectronic assembly of claim 1, wherein the recess is tapered, becoming smaller with increasing distance from the rear face of the at least one microelectronic element.

17. The microelectronic assembly of claim 16, wherein walls of the recess are oriented at an angle of about 5 degrees or greater with respect to a normal to the rear face of the at least one microelectronic element.

18. The microelectronic assembly of claim 17, wherein the walls are oriented at an angle of less than or equal to about 40 degrees with respect to a normal to the rear face of the at least one microelectronic element.

19. The microelectronic assembly of claim 1, wherein a dielectric layer contacts the bond pad within the recess, the conductive via extends through the dielectric layer and the bond pad, and an entire area of the via in a direction along a major surface of the bond pad is enclosed within an area of the major surface of the bond pad.

20. A method is provided for forming a microelectronic assembly having a plurality of stacked microelectronic elements therein, the method comprising:
   forming a plurality of subassemblies, each formed using steps including:
   (a) bonding a microelectronic element to a carrier such that a plurality of metallic pads exposed at a front face of the microelectronic element confront the carrier;
   (b) forming a recess extending from a rear face of a microelectronic element towards the metallic pad exposed at the front face of the microelectronic element;
   (c) depositing a dielectric layer onto the rear face and into the recess;
   (d) forming a hole extending through the dielectric layer within the recess and through the metallic pad within the recess; and
   (e) forming a conductive layer overlying the dielectric layer and extending along the rear face and within the hole, the conductive layer being electrically connected to the metallic pad;
   stacking the plurality of subassemblies in at least approximate alignment, with the carrier between at least adjacent subassemblies optionally removed; and
   forming leads and terminals electrically connected to the conductive layers of the microelectronic elements of the plurality of subassemblies.

21. The method as claimed in claim 20, wherein step (b) includes removing semiconductor material of the microelectronic element until a second dielectric layer is exposed, the second dielectric layer contacting a surface of the metallic pad, and step (d) includes forming the through hole extending through the dielectric layer, the second dielectric layer and the metallic pad.

22. A method of forming a microelectronic package, comprising:
   (a) forming a recess extending from a rear face of a microelectronic element towards a metallic pad exposed at a front face of the microelectronic element;
   (b) depositing a dielectric layer onto the rear face and into the recess;
   (c) patterning the dielectric layer overlying the rear face;
   (d) forming a hole extending through the dielectric material and through the metallic pad; and
   (e) forming a conductive layer overlying the dielectric layer and extending along the rear face and within the hole, the conductive layer being electrically connected to the metallic pad.

23. A method of forming a plurality of microelectronic assemblies, comprising:
   forming a plurality of subassemblies, each formed using steps including:
   (a) mounting a plurality of first microelectronic elements atop a dielectric element, each first microelectronic element having a front face adjacent the dielectric element and a plurality of metallic pads exposed at the front face;
   (b) forming recesses extending from rear faces of the first microelectronic elements towards the front faces;
   (c) forming a dielectric layer between edges of the first microelectronic elements, the dielectric layer extending onto the rear faces of the first microelectronic elements and into the recesses;
   (d) forming through holes extending from the recesses through the metallic pads; and
   (e) forming conductive elements extending within the recesses and the through holes and along the rear faces of the first microelectronic elements towards edges of the first microelectronic elements, the conductive elements electrically contacting the metallic pads within the through holes;
   stacking the plurality of subassemblies in at least approximate alignment, with the dielectric element between at least adjacent subassemblies optionally removed;
   forming leads electrically connected with the conductive elements of the microelectronic elements of the subassemblies; and
   severing the plurality of stacked subassemblies along edges of the microelectronic elements into individual microelectronic assemblies, each microelectronic assembly including terminals electrically connected to the metallic pads of the microelectronic elements of the subassemblies therein.

* * * * *

UNITED STATES PATENT AND TRADEMARK OFFICE
CERTIFICATE OF CORRECTION

PATENT NO. : 8,466,542 B2
APPLICATION NO. : 12/723039
DATED : June 18, 2013
INVENTOR(S) : Moshe Kriman et al.

It is certified that error appears in the above-identified patent and that said Letters Patent is hereby corrected as shown below:

IN THE SPECIFICATION:

Column 23, line 65, insert --face-- after "front".
Column 23, line 67, insert --of the at least one microelectronic element-- after "recess".
Column 24, lines 2-3, delete "of the least one microelectronic element" after "recess".
Column 25, lines 50-51, delete "within the recess" after "pad".

Signed and Sealed this
Seventh Day of April, 2015

Michelle K. Lee
*Director of the United States Patent and Trademark Office*